United States Patent
Suzuki et al.

(10) Patent No.: US 6,926,973 B2
(45) Date of Patent: *Aug. 9, 2005

(54) COPOLYMER, POLYMER COMPOSITION AND POLYMER LIGHT-EMITTING DEVICE

(75) Inventors: Tomoyuki Suzuki, Tsukuba (JP); Shuji Doi, Tsukuba (JP); Takanobu Noguchi, Tsukuba (JP); Akihiko Okada, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/322,046

(22) Filed: Dec. 18, 2002

(65) Prior Publication Data

US 2003/0143429 A1 Jul. 31, 2003

(30) Foreign Application Priority Data

Dec. 19, 2001 (JP) ............................. 2001-385833
Mar. 29, 2002 (JP) ............................. 2002-095650

(51) Int. Cl.$^7$ .......................... H05B 33/14; C09K 11/06; C08G 61/00
(52) U.S. Cl. ................. 428/690; 428/917; 313/504; 313/506; 252/301.16; 252/301.35; 257/40; 526/280; 528/394; 528/397
(58) Field of Search ................. 428/690, 917; 313/504, 506; 252/301.16, 301.35; 257/40; 526/280; 528/394, 397

(56) References Cited

U.S. PATENT DOCUMENTS

| | | | | |
|---|---|---|---|---|
| 5,821,002 A | * | 10/1998 | Ohnishi et al. | 428/690 |
| 6,444,334 B1 | * | 9/2002 | Doi et al. | 428/690 |
| 2002/0051895 A1 | * | 5/2002 | Cho et al. | 428/690 |

FOREIGN PATENT DOCUMENTS

| JP | 63-70257 A | 3/1988 |
|---|---|---|
| JP | 63-175860 A | 7/1988 |
| JP | 2-135359 A | 5/1990 |
| JP | 2-135361 A | 5/1990 |
| JP | 2-209988 A | 8/1990 |
| JP | 3-37992 A | 2/1991 |
| JP | 3-152184 A | 6/1991 |
| JP | 3161058 B2 | 2/1994 |
| JP | 2001-504533 A | 4/2001 |
| JP | 2001-507511 A | 6/2001 |
| JP | 2001-226469 A | 8/2001 |
| JP | 2001-247861 A | 9/2001 |
| JP | 2001-261796 A | 9/2001 |
| JP | 2001-278958 A | 10/2001 |

OTHER PUBLICATIONS

Bernius, et al., Fluorene–Based Polymers–Preparation and Applications, J. Mater. Sci. Mater. Ele., vol. 11, pp. 111–116 (2000).

Oda et al, Circular Polarized Electroluminescence from Liquid–Crystalline Chiral Polyfluorenes, Adv. Mater. vol. 12, pp. 362–365 (2000).

* cited by examiner

*Primary Examiner*—Rena Dye
*Assistant Examiner*—Camie S Thompson
(74) *Attorney, Agent, or Firm*—Sughrue Mion, PLLC

(57) ABSTRACT

A copolymer has a polystyrene reduced number average molecular weight of $10^3$–$10^8$, and includes repeating units represented by formulas (1), (2), and (3),

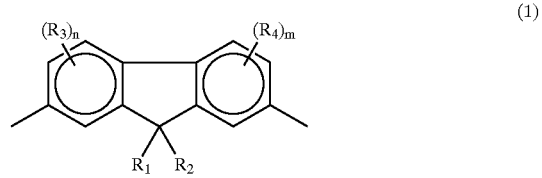

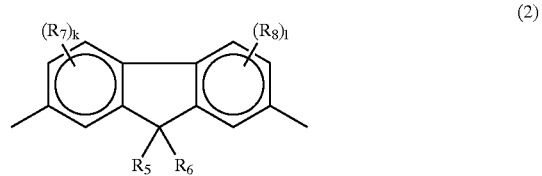

$$-\text{Ar}_1- \quad (3)$$

The copolymer has an excellent solubility in an organic solvent, and a high glass transition temperature in good valance. Further, a polymer LED has high performance, such as low-voltage driving and high luminance.

66 Claims, No Drawings

COPOLYMER, POLYMER COMPOSITION AND POLYMER LIGHT-EMITTING DEVICE

BACKGROUND OF THE INVENTION

1. Field of the Invention

The present invention relates to a copolymer, a polymer composition and a polymer light-emitting device (hereafter, referred to as "polymer LED").

2. Description of the Related Art

Electronic materials using polymer compounds are variously investigated for electronic devices. Among them, copolymers having a substituted or non-substituted repeating unit consisting of fluorene-2,7-diyl group (fluorene repeating unit) are studied since a light emitting layer etc. in a light-emitting device can be formed by a coating method, for example, as a polymer light-emitting material (polymeric fluorescent substance).

As a copolymer having a fluorene repeating unit, for example, J. Mater. Sci. Mater. Ele., volume 11, page 111 (2000) discloses a copolymer consisting of one kind of fluorene repeating unit, and a repeating unit, such as phenylene or naphthalene-diyl. Moreover, as a copolymer consisting of two kinds of fluorene repeating units, for example, Adv. Mater. volume 12, page 362 (2000) discloses a 1:1 copolymer of 2,7-[9,9-bis(2S-2-methylbutyl)]fluorene and 2,7-(9,9-bisdioctyl)fluorene.

In order to produce a light emitting layer of a light-emitting device uniformly by a coating method using a fluorene copolymer as a polymeric fluorescent substance, excellent solubility of the copolymer in an organic solvent is required. Moreover, in order to improve the stability of the light-emitting device, high glass transition temperature of the copolymer is required.

However, the above known fluorene copolymers still have insufficient solubility in an organic solvent or insufficient glass transition temperature.

The object of the present invention is to provide a copolymer comprising a fluorene repeating unit, having an excellent solubility in an organic solvent, and a high glass transition temperature in good balance, and to provide a polymer LED of high performance, such as low-voltage driving and high luminance, with using the copolymer.

As a result of intensive studies to solve the above-mentioned problems, the present inventors found that a copolymer having two kinds of fluorene repeating units, and a repeating unit, such as phenylene, or a copolymer having two kinds of fluorene repeating units in a specific ratio, has an excellent solubility in an organic solvent and a high glass transition temperature in sufficiently good balance, and completed the present invention.

Moreover, as a result of further study, the present inventors found that a copolymer having a polystyrene reduced number average molecular weight of $10^3$–$10^8$, and exhibiting fluorescence in the solid state, wherein the below defined value $T_{1\rho}H/<T_{1\rho}H>$ is 0.35 or less, has an excellent solubility in an organic solvent, and that a polymer composition comprising two kinds or more of copolymers having a polystyrene reduced number average molecular weight of $10^3$–$10^8$, and exhibiting fluorescence in the solid state, wherein the below defined value $T_{1\rho}H/<T_{1\rho}H>$ is 0.35 or less, can give a uniform film.

SUMMARY OF THE INVENTION

That is, the present invention relates to [1] a copolymer having a polystyrene reduced number average molecular weight of $10^3$–$10^8$, and comprising a repeating unit represented by formula (1), one or more kinds of repeating units represented by formula (2), and one or more kinds of repeating units represented by formula (3).

Furthermore, the present invention relates to [2] a copolymer having a polystyrene reduced number average molecular weight of $10^3$–$10^8$, wherein the copolymer comprises a repeating unit represented by the above formula (1) and one or more kinds of repeating units represented by the above formula (2); the repeating unit represented by an above formula (1) is 10 to 40% based on the total of the moles of the repeating unit represented by the above formulas (1) and (2); and the formula weight of the repeating unit represented by formula (1) is smaller than any of the formula weight of the repeating unit represented by formula (2).

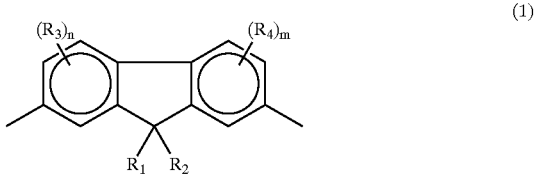

(1)

wherein, $R_1$ and $R_2$ each independently show a hydrogen atom, alkyl group, aryl group, or monovalent heterocyclic group; $R_3$ and $R_4$ each independently show alkyl group, alkoxy group, alkylthio group, alkylsilyl group, alkylamino group, aryl group, aryloxy group, arylsilyl group, arylamino group, arylalkyl group, arylalkoxy group, arylalkyl silyl group, arylalkyl amino group, monovalent heterocyclic group, or cyano group; m and n each independently show an integer of 0–3; when n is two or more, a plurality of $R_3$s may be the same or different; when m is two or more, a plurality of $R_4$ may be the same or different; two or more of $R_1$, $R_2$, $R_3$ and $R_4$, may be mutually connected to form a ring; and when $R_1$, $R_2$, $R_3$, or $R_4$ contains an alkyl chain, the alkyl chain may be interrupted by a group containing a hetero atom,

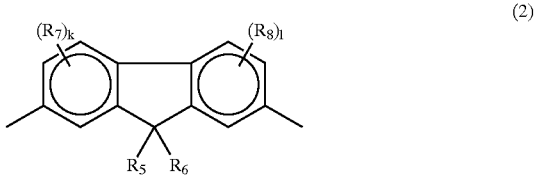

(2)

wherein, $R_5$ and $R_6$ each independently show a hydrogen atom, alkyl group, aryl group, or a monovalent heterocyclic group; either $R_5$ or $R_6$ is different from either $R_1$ or $R_2$; $R_7$ and $R_8$ each independently show an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, monovalent heterocyclic group, or cyano group; k and l are each independently an integer of 0 to 3; when k is two or more, a plurality of $R_7$s are the same or different; when l is two or more, a plurality of $R_8$ is the same or different; two or more of $R_5$, $R_6$, $R_7$ and $R_8$, may be connected mutually to form a ring; and when $R_5$, $R_6$, $R_7$, or $R_8$ contains an alkyl chain, the alkyl chain may be interrupted by a group containing a hetero atom, —Ar$_1$— (3).

wherein, Ar$_1$ shows an arylene group, divalent heterocyclic group, or divalent aromatic amine group.

Further. the present invention relates to [3] a copolymer having a polystyrene reduced number average molecular weight of $10^3–10^8$, and exhibiting fluorescence in the solid state, wherein the value ($\Delta T_{1\rho}H/<T_{1\rho}H>$) obtained by dividing the difference ($\Delta T_{1\rho}H$) between the maximum value of $T_{1\rho}H$ and the minimum value of $T_{1\rho}H$ by the average value ($<T_{1\rho}H>$) of $T_{1\rho}H$, is 0.35 or less; here, relaxation-time ($T_{1\rho}H$) of proton in a spin lock magnetic field is measured by $^{13}C$ nuclear magnetic resonance with carrying out high-speed rotation of the film of the copolymer around a magic angle (axis inclined to static magnetic field by 54.7°) in solid nuclear magnetic resonance. Furthermore, the present invention relates to [4] a polymer composition comprising a copolymer having a polystyrene reduced number average molecular weight of $10^3–10^8$, and exhibiting fluorescence in the solid state, and a copolymer described in the above [1] or [2].

Furthermore, the present invention relates to [5] a polymer composition comprising a copolymer of the above [1] and a copolymer of the above [2].

Furthermore, the present invention relates to [6] a polymer composition exhibiting fluorescence in the solid state, and comprising two of more kinds of polymer compounds having a polystyrene reduced number average molecular weight of $10^3–10^8$, wherein $T_{1\rho}H/<T_{1\rho}H>$ is 0.35 or less, here, $T_{1\rho}H$ is measured by $^{13}C$ nuclear magnetic resonance with carrying out high-speed rotation of the film of the polymer composition around a magic angle in solid nuclear magnetic resonance.

DETAILED DESCRIPTION OF THE INVENTION

The copolymer [1] of the present invention is a copolymer whose polystyrene reduced number average molecular weight is $10^3–10^8$, and comprising a repeating unit represented by the above formula (1), one or more kinds of repeating units represented by the above formula (2), and one or more kinds of repeating units represented by the above formula (3).

$R_1$ and $R_2$ of the above formula (1), and $R_5$ and $R_6$ of the above formula (2) each independently represent a hydrogen atom, an alkyl group, an aryl group or a monovalent heterocyclic group.

The alkyl group may be any of linear, branched or cyclic, and usually has about 1 to 20 carbon atoms, and specific examples thereof include methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, etc., and preferable are pentyl group, isoamyl group, hexyl group, octyl group, 2-ethylhexyl group, decyl group and 3,7-dimethyloctyl group.

The aryl group usually has about 6 to 60 carbon atoms, and specific examples thereof include a phenyl group, $C_1–C_{12}$ alkoxyphenyl group, $C_1–C_{12}$ alkylphenyl group, phenoxy $C_1–C_{12}$ alkyl group, $C_1–C_{12}$ alkylphenoxy $C_1–C_{12}$ alkyl group, 1-naphthyl group, 2-naphthyl group, etc. In view of high glass transition temperature, $C_1–C_{12}$ alkoxyphenyl group $C_1–C_{12}$ alkylphenyl group, phenoxy $C_1–C_{12}$ alkyl group, and $C_1–C_{12}$ alkylphenoxy $C_1–C_{12}$ alkyl group are preferable. As for the aryl group, a part of hydrogen atoms may be substituted by a halogen atom.

Here, $C_1–C_{12}$ alkyl means an alkyl group having 1 to 12 carbon atoms. The alkyl group may be may be either linear or branched. The alkoxy group means an alkoxy group having 1 to 12 carbon atoms. The alkoxy group may be either linear or branched.

The monovalent heterocyclic group usually has about 4 to 60 carbon atoms, and specific examples thereof include a thienyl group, $C_1–C_{12}$ alkyl thienyl group ($C_1–C_{12}$ means 1 to 12 carbon atoms, the same in the following), pyroryl group, furyl group, pyridyl group, $C_1–C_{12}$ alkylpyridyl group, etc., and preferable are thienyl group, $C_1–C_{12}$ alkylthienyl group, pyridyl group, and $C_1–C_{12}$ alkyl pyridyl group.

In order to make a glass transition temperature high, $R_1$, $R_2$, $R_5$ and $R_6$ are preferably an alkyl group having 12 or less of carbon atoms, an aryl group, or a monovalent heterocyclic group; more preferably an alkyl group having 9 or less of carbon atoms, an aryl group, or a monovalent heterocyclic group; and further preferably an alkyl group having 8 or less of carbon atoms, an aryl group, or a monovalent heterocyclic group.

The carbon atom numbers of $R_1$ and $R_3$ may be mutually the same or different, but preferably they are different. The carbon atom numbers of $R_1$ and $R_4$ may be mutually the same or different, but preferably they are different. Similarly, the carbon atom numbers of $R_2$ and $R_3$, and those of $R_2$ and $R_4$ may be also the same or different, but preferably they are different.

$R_1$ and $R_2$ in formula (1), are preferably an alkyl group and an aryl group, more preferably an alkyl group, further preferably an alkyl group having 8 or less of carbon atoms, especially preferably an alkyl group having 5 or less of carbon atoms, and most preferably isobutyl group. When $R_1$ and $R_2$ are alkyl groups, they may be any of linear, branched or cyclic, and preferably branched.

$R_5$ and $R_6$ in formula (2), are preferably an alkyl group, an aryl group, and a monovalent heterocyclic group, more preferably an alkyl group having 7–8 carbon atoms, an aryl group having 7–8 carbon atoms, and a monovalent heterocyclic group having 7–8 carbon atoms, especially preferably an alkyl group having 7–8 carbon atoms, and most preferably n-octyl group.

In the above formula (1), m and n are each independently an integer of 0 to 3. When m is two or more, a plurality of $R_4$ may be the same or different. When n is two or more, a plurality of $R_3$ may be the same or different. Moreover, two or more of $R_1–R_4$ may be connected to form a ring. When $R_1–R_4$ is a group containing an alkyl chain, said alkyl chain may be interrupted by a group containing a hetero atom.

In the above formula (2), k and l are each independently an integer of 0 to 3. When k is two or more, a plurality of $R_7$ is the same or different. When l is two or more, a plurality of $R_8$ is the same or different. Moreover, two or more of $R_5–R_8$ may be connected to form a ring. Furthermore, when $R_5–R_8$ is a group containing an alkyl chain, said alkyl chain may be interrupted by a group containing a hetero atom.

Here, as a hetero atom in the group containing a hetero atom, exemplified are an oxygen atom, a sulfur atom, a nitrogen atom, etc.

As the group containing a hetero atom, following groups are exemplified.

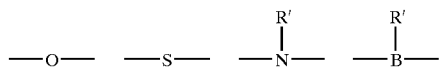

-continued

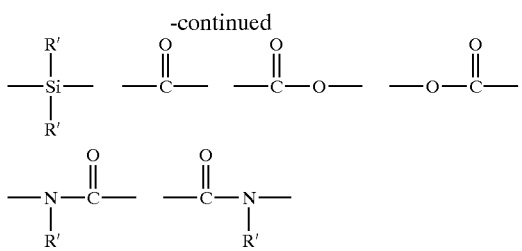

Here, as R', exemplified are, a hydrogen atom, an alkyl group having 1–20 carbon atoms, an aryl group having 6–60, and a monovalent heterocyclic group having 4–60 carbon atoms.

$R_3$ and $R_4$ in the above formula (1), and $R_7$ and $R_8$ in the above formula (2) each independently represent an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, arylalkenyl group, arylalkynyl group, monovalent heterocyclic group, or cyano group, and an alkyl group and an alkoxy group are preferable.

The alkyl group may be any of linear, branched, or cyclic, and usually has about 1 to 20 carbon atoms, and specific examples thereof include a methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, etc. Pentyl group, isoamyl group, hexyl group, octyl group, 2-ethylhexyl group, decyl group, and 3,7-dimethyloctyl group are preferable.

The alkoxy group may be any of linear, branched or cyclic, and usually has about 1 to 20 carbon atoms, and specific examples thereof include methoxy group, ethoxy group, propyloxy group, i-propyloxy group, butoxy group, i-butoxy group, t-butoxy group, pentyloxy group, isoamyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, etc. Pentyloxy group, isoamyloxy group, hexyloxy group, octyloxy group, 2-ethylhexyloxy group, decyloxy group, and 3,7-dimethyloctyloxy group are preferable.

The alkylthio group may be any of linear, branched or cyclic, and usually has about 1 to 20 carbon atoms, and specific examples thereof include methylthio group, ethylthio group, propylthio group, i-propylthio group, butylthio group, i-butylthio group, t-butylthio group, pentylthio group, isoamylthio group, hexylthio group, cyclo hexylthio group, heptylthio group, octylthio group, 2-ethyl hexylthio group, nonylthio group, decylthio group, 3,7-dimethyloctylthio group, laurylthio group, etc. Pentylthio group, isoamylthio group, hexylthio group, octylthio group, 2-ethylhexylthio group, decylthio group, and 3,7-dimethyl octylthio group are preferable.

The alkylsilyl group may be any of linear, branched or cyclic, and usually has about 1 to 60 carbon atoms, and specific examples thereof include methylsilyl group, ethyl silyl group, propylsilyl group, i-propylsilyl group, butyl silyl group, i-butylsilyl group, t-butylsilyl group, pentyl silyl group, isoamylsilyl group, hexylsilyl group, cyclohexyl silyl group, heptylsilyl group, octylsilyl group, 2-ethylhexyl silyl group, monylsilyl group, decylsilyl group, 3,7- dimethyloctylsilyl group, laurylsilyl group, tri methylsilyl group, ethyldimethylsilyl group, propyldimethyl silyl group, i-propyldimethyl silyl group, butyldimethyl silyl group, t-butyldimethyl silyl group, pentyldimethyl silyl group, isoamyldimethyl silyl group, hexyldimethyl silyl group, heptyldimethyl silyl group, octyldimethyl silyl group, 2-ethylhexyl-dimethyl silyl group, nonyldimethyl silyl group, decyldimethyl silyl group, 3,7-dimethyloctyl-dimethyl silyl group, lauryldimethyl silyl group etc. Pentyl silyl group, isoamyl silyl group, hexyl silyl group, octyl silyl group, 2-ethylhexyl silyl group, decyl silyl group, 3,7-dimethyloctyl silyl group, pentyldimethyl silyl group, isoamyldimethyl silyl group, hexyldimethyl silyl group, octyldimethyl silyl group, 2-ethylhexyl-dimethyl silyl group, dimethyl silyl group, and 3,7-dimethyloctyl-dimethyl silyl group are preferable.

The alkylamino group may be any of linear, branched or cyclic, and either of a monoalkylamino group or a dialkylamino group. The alkylamino group usually has about 1 to 40 carbon atoms, and specific examples thereof include methylamino group, dimethylamino group, ethylamino group, diethylamino group, propylamino group, i-propylamino group, butylamino group, i-butylamino group, t-butylamino group, pentylamino group, isoamylamino group, hexylamino group, cyclohexylamino group, heptylamino group, octylamino group, 2-ethylhexylamino group, nonylamino group, decylamino group, 3,7-dimethyloctylamino group, laurylamino group, etc. Pentylamino group, isoamylamino group, hexylamino group, octylamino group, 2-ethylhexylamino group, decylamino group, and 3,7-dimethyloctyl amino group are preferable.

The aryl group usually has about 6 to 60 carbon atoms. Specific examples thereof include a phenyl group, $C_1$–$C_{12}$ alkoxyphenyl group, $C_1$–$C_{12}$ alkylphenyl group, 1-naphthyl group, 2-naphthyl group, etc. $C_1$–$C_{12}$ alkoxy phenyl group, and $C_1$–$C_{12}$ alkyl phenyl group are preferable. The aryl group means an atomic group in which one hydrogen atom is removed from an aromatic hydrocarbon.

The aryloxy group usually has 6 to 60 carbon atoms. Specific examples thereof include a phenoxy group, $C_1$–$C_{12}$ alkoxy phenoxy group, $C_1$–$C_{12}$ alkyl phenoxy group, 1-naphtyloxy group, 2-naphtyloxy group, etc. $C_1$–$C_{12}$ alkoxy phenoxy group, and $C_1$–$C_{12}$ alkyl phenoxy group are preferable.

The aryl silyl group usually has 6 to 60 carbon atoms. Specific examples thereof include a phenyl silyl group, $C_1$–$C_{12}$ alkoxy phenylsilyl group, $C_1$–$C_{12}$ alkyl phenylsilyl group, 1-naphtylsilyl group, 2-naphtylsilyl group, dimethylphenylsilyl group, etc. $C_1$–$C_{12}$ alkoxy phenylsilyl group and $C_1$–$C_{12}$ alkyl phenylsilyl group are preferable.

The aryl amino group usually has 6 to 60 carbon atoms. Specific examples thereof include a phenylamino group, diphenylamino group, $C_1$–$C_{12}$ alkoxy phenylamino group, di ($C_1$–$C_{12}$ alkoxy phenyl)amino group, di($C_1$–$C_{12}$ alkylphenyl) amino group, 1-naphtylamino group, 2-naphtylamino group, etc. $C_1$–$C_{12}$ alkyl phenylamino group, and di($C_1$–$C_{12}$ alkyl phenyl)amino group are preferable.

The arylalkyl group usually has 7 to 60 carbon atoms. Specific examples thereof include a phenyl-$C_1$–$C_{12}$ alkyl group, $C_1$–$C_{12}$ alkoxyphenyl-$C_1$–$C_{12}$ alkyl group, $C_1$–$C_{12}$ alkyl phenyl-$C_1$–$C_{12}$ alkyl group, 1-naphtyl-$C_1$–$C_{12}$ alkyl group, 2-naphtyl-$C_1$–$C_{12}$ alkyl group, etc. $C_1$–$C_{12}$ alkoxy phenyl-$C_1$–$C_{12}$ alkyl group, and $C_1$–$C_{12}$ alkyl phenyl-$C_1$–$C_{12}$ alkyl group are preferable.

The aryl alkoxy group usually has 7 to 60 carbon atoms. Specific examples thereof include a phenyl-$C_1$–$C_{12}$ alkoxy group, $C_1$–$C_{12}$ alkoxy phenyl-$C_1$–$C_{12}$ alkoxy group, $C_1$–$C_{12}$ alkyl phenyl-$C_1$–$C_{12}$ alkoxy group, 1-naphtyl-$C_1$–$C_{12}$ alkoxy group, 2-naphtyl-$C_1$–$C_{12}$ alkoxy group, etc. $C_1$–$C_{12}$ alkoxy phenyl-$C_1$–$C_{12}$ alkoxy group, and $C_1$–$C_{12}$ alkyl phenyl-$C_1$–$C_{12}$ alkoxy group are preferable.

The arylalkylsilyl group usually has 7 to 60 carbon atoms. Specific examples thereof include a phenyl-$C_1$–$C_{12}$ alkyl silyl group, $C_1$–$C_{12}$ alkoxy phenyl-$C_1$–$C_{12}$ alkyl silyl group, $C_1$–$C_{12}$ alkyl phenyl-$C_1$–$C_{12}$ alkyl silyl group, 1-naphtyl-$C_1$–$C_{12}$ alkyl silyl group, 2-naphtyl-$C_1$–$C_{12}$ alkyl silyl group, phenyl-$C_1$–$C_{12}$ alkyl dimethyl silyl group, etc. $C_1$–$C_{12}$ alkoxy phenyl-$C_1$–$C_{12}$ alkyl silyl group, and $C_1$–$C_{12}$ alkyl phenyl-$C_1$–$C_{12}$ alkyl silyl group are preferable.

The arylalkylamino group usually has 7 to 60 carbon atoms. Specific examples thereof include a phenyl-$C_1$–$C_{12}$ alkyl amino group, $C_1$–$C_{12}$ alkoxy phenyl-$C_1$–$C_{12}$ alkyl amino group, $C_1$–$C_{12}$ alkyl phenyl-$C_1$–$C_{12}$ alkyl amino group, di($C_1$–$C_{12}$ alkoxy phenyl-$C_1$–$C_{12}$ alkyl)amino group, di($C_1$–$C_{12}$ alkyl phenyl-$C_1$–$C_{12}$ alkyl)amino group, 1-naphtyl-$C_1$–$C_{12}$ alkyl amino group, 2-naphtyl-$C_1$–$C_{12}$ alkyl amino group, etc. $C_1$–$C_{12}$ alkyl phenyl-$C_1$–$C_{12}$ alkyl amino group, and di($C_1$–$C_{12}$ alkyl phenyl-$C_1$–$C_{12}$ alkyl) amino group are preferable.

The arylalkenyl group usually has 8 to 60 carbon atoms. Specific examples thereof include a phenyl-$C_1$–$C_{12}$ alkenyl group, $C_1$–$C_{12}$ alkoxy phenyl-$C_1$–$C_{12}$ alkenyl group, $C_1$–$C_{12}$ alkyl phenyl-$C_1$–$C_{12}$ alkenyl group, 1-naphtyl-$C_1$–$C_{12}$ alkenyl group, 2-naphtyl-$C_1$–$C_{12}$ alkenyl group, etc. $C_1$–$C_{12}$ alkoxy phenyl-$C_1$–$C_{12}$ alkenyl group, and $C_1$–$C_{12}$ alkyl phenyl-$C_1$–$C_{12}$ alkenyl group are preferable.

The arylalkynyl group usually has 8 to 60 carbon atoms. Specific examples thereof include a phenyl-$C_1$–$C_{12}$ alkynyl group, $C_1$–$C_{12}$ alkoxy phenyl-$C_1$–$C_{12}$ alkynyl group, $C_1$–$C_{12}$ alkyl phenyl-$C_1$–$C_{12}$ alkynyl group, 1-naphtyl-$C_1$–$C_{12}$ alkynyl group, 2-naphtyl-$C_1$–$C_{12}$ alkynyl group, etc. $C_1$–$C_{12}$ alkoxy phenyl-$C_1$–$C_{12}$ alkynyl group, and $C_1$–$C_{12}$ alkyl phenyl-$C_1$–$C_{12}$ alkynyl group are preferable.

The monovalent heterocyclic group usually has 4 to 60 carbon atoms. Specific examples thereof include a thienyl group, $C_1$–$C_{12}$ alkylthienyl group, pyroryl group, furyl group, pyridyl group, $C_1$–$C_{12}$ alkylpyridyl group, etc. A thienyl group, $C_1$–$C_{12}$ alkylthienyl group, pyridyl group, and $C_1$–$C_{12}$ alkylpyridyl group are preferable. The monovalent heterocyclic group means an atomic group in which a hydrogen atom is removed from a heterocyclic compound.

$Ar_1$ in the repeating unit represented by the above formula (3) is an arylene group or a divalent heterocyclic group.

The arylene group is an atomic group of an aromatic hydrocarbon in which two hydrogen atoms are removed. The aromatic hydrocarbon includes those containing a condensed ring, and those containing two or more of independent benzene rings or condensed rings bonded through a group such as a direct bond, a vinylene group or the like. The arylene group usually has 6 to 60 carbon atoms. Specific examples thereof include a phenylene group, biphenylene group, terphenylene group, naphthalene-diyl group, anthracene-diyl group, phenanthrene-diyl group, pentalene-diyl group, indene-diyl group, heptalene-diyl group, indacene-diyl group, triphenylene-diyl group, binaphthyl-diyl group, phenylnaphthylene-diyl group, stilbene-diyl group, 3,3'-alkoxystilbene-diyl group, etc. Here, the carbon atoms in the substituent is not counted as the carbon atom of the arylene group.

The divalent heterocyclic group means an atomic group in which two hydrogen atoms are removed from a heterocyclic compound, and usually has 4 to 60 carbon atoms. Specific examples thereof include furan-diyl group, thienylene group, fluorene-diyl group, pyridine-diyl group, quinoline-diyl group, quinoxaline-diyl group, etc. Here, the carbon atoms in the substituent is not counted as the carbon atom of the divalent heterocyclic group. The heterocyclic compound means an organic compound having a cyclic structure in which at least one heteroatom such as oxygen, sulfur, nitrogen, phosphorus, boron, etc. is contained in the cyclic structure as the element other than carbon atoms.

$Ar_1$ in formula (3) may have a substituent, such as an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, arylalkenyl group, and arylalkynyl group.

In the copolymers of the present invention (1), it is preferable that the formula weight of the repeating unit represented by the above formula (1) is smaller than the formula weight of the repeating unit represented by the above formula (2). Here, the formula weight of repeating unit means the sum of the atomic weight multiplied by the number of atoms about each element in the chemical formula of the repeating unit.

When the total amount of the repeating units represented by the above formulas (1), (2) and (3), is too small in a copolymer, properties, such as luminance or life time of the device, may not be satisfactory. Therefore, it is preferable that the total of the repeating units represented by formulas (1), (2) and (3) is 50% by mole or more based on all of the repeating units contained in the copolymer. It is preferably 60% by mole or more, and more preferably 70% by mole or more, further preferably 80% by mole, especially preferably 90% by mole or more, and the most preferably 100% by mole.

The repeating unit represented by formula (1) is preferably 10–90% by mole based on the total of the repeating unit represented by formulas (1) and (2), more preferably 10–70% by mole, further preferably 10–40% by mole, and further more preferably 20–30% by mole. Moreover, the total of the repeating unit represented by formula (3) is preferably 10% by mole or more based on the total of the repeating unit represented by formulas (1), (2) and (3), and more preferably 20% by mole or more.

The copolymer of the present invention [2] contains one or more kinds of repeating units represented by the above formula (1) and formula (2), respectively; the repeating unit represented by formula (1) is 10–40%, preferably 20–30% based on the total of the moles of the repeating units represented by formulas (1) and (2); the formula weight of the repeating unit represented by formula (1) is smaller than the formula weight of the repeating unit represented by formula (2); and the polystyrene reduced number average molecular weight is $10^3$–$10^8$. When the repeating unit represented by formula (1) is outside the above range, polymer LED using the copolymer have insufficient characteristics such as luminance, life time, or the like.

When the total amount of the repeating units represented by formula (1) and (2) in the copolymer is too little, characteristics, such as luminance and life time of a device produced therefrom, may not be satisfactory. Therefore, as for the total of the repeating units represented by formulas (1) and (2), it is preferably 50% by mole or more based on all the repeating units in the copolymer, more preferably 60% by mole or more, still preferably 70% by mole or more, further preferably 80% by mole, especially preferably 90% by mole or more, and most preferably 100% by mole.

Among the copolymers of the present invention [2], the below defined $\Delta T_{1\rho}H/<T_{1\rho}H>$ is preferably 0.35 in view of solubility.

The copolymer of the present invention [3] has a polystyrene reduced number average molecular weight of $10^{3-10^8}$, and exhibits fluorescence in the solid state, wherein the value ($\Delta T_{1\rho}H/<T_{1\rho}H>$) obtained by dividing the difference ($\Delta T_{1\rho}H$) between the maximum value of $T_{1\rho}H$ and the minimum value of $T_{1\rho}H$ by the average value ($<T_{1\rho}H>$) of $T_{1\rho}H$, is 0.35 or less; here, relaxation-time ($T_{1\rho}H$) of proton in a spin lock magnetic field is measured by $^{13}C$ nuclear magnetic resonance with carrying out high-speed rotation of the film of the copolymer around a magic angle in solid nuclear magnetic resonance.

$\Delta T_{1\rho}H/<T_{1\rho}H>$ is preferably 0.3 or less, and more preferably 0.15 or less. When $\Delta T_{1\rho}H/<T_{1\rho}H>$ is in the above range, the solubility in an organic solvent of the copolymer is excellent.

$\Delta T_{1\rho}H/<T_{1\rho}H>$ can be obtained as follows.

A copolymer film which is a sample to be measured can be produced by usual method. For example, a determined amount of a copolymer is dissolved in a solvent, a film is formed by a method, such as a casting method, spin-coating method, bar-coating method, dip-coating method, etc. As the solvent, exemplified are benzene, toluene, xylene, chloroform, methylene chloride, carbon tetrachloride, cyclohexane, hexane, diethyl ether, tetrahydrofuran, 1,4-dioxane, acetone, methylethylketone, cyclohexanone, methylacetate, and ethyl acetate, without being limited. The solvent used for film formation is removed before measurement. The film thickness of the film is usually about several microns to several 10 microns.

The film produced by the above method is put into a sample tube, 90° pulse is irradiated to proton with rotating around a magic angle (axis inclined to static magnetic field by 54.7°) in 5000 to 15000 revolutions per second, and spin-locked. After carrying out spin-lock of the proton nucleus for δ seconds (spin-lock time) and relaxing the proton nucleus in the spin-lock magnetic field, magnetization is moved to the nucleus of $^{13}C$ by cross-polarization method, and the peak strength of $^{13}C$ is observed by plotting the peak strength to δ, $T_{1\rho}H$ is obtained for the numbers of $^{13}C$ peaks.

Magnetic field strength usually used is from 2 teslas to 20 teslas, and preferably from 4 teslas to 10 teslas. For $T_{1\rho}H$ measurement, spin lock time ô is set to a very short time about 10i second as the initial value, and including this, it is necessary to measure 5 or more points, preferably 10 to 15 points, with changing δ value according to $T_{1\rho}H$ distribution.

Moreover, it is preferable to perform satisfactory integration to obtain a good spectrum with few noises. Measurement temperature is preferably set to a temperature below the glass transition temperature of the film in view of preventing the change of the solid state in the measurement, and since $T_{1\rho}H$ changes with temperature, the measurement temperature is preferably fixed constant.

For $T_{1\rho}H$ calculation, it is necessary that the peak strength of $^{13}C$ is larger than the noise level, and the base line of the spectrum is sufficiently smooth to the noise. As the method of determining the noise level, a usual method can be used, and the mean square of the gap between the theoretical relaxation curve calculated from computed $T_{1\rho}H$ and the actually observed value can be used preferably. As $T_{1\rho}H$, when based on the obtained noise level by the above method, it is necessary to adopt only $T_{1\rho}H$ obtained from a peak whose $^{13}C$ peak strength in the initial value of spin lock time τ is 8 times or more to the noise level for calculation of $\Delta T_{1\rho}H/<T_{1\rho}H>$. When other well-known computing methods are used for the noise level, it is required to adopt only $T_{1\rho}H$ obtained from a peak sufficiently larger than the noise level for $\Delta T_{1\rho}H/<T_{1\rho}H>$ calculation according to the case using the mean square of the gap between the theoretical relaxation curve and the actually observed value as the noise level. Moreover, when the number of available peaks is less than 5, $\Delta T_{1\rho}H/<T_{1\rho}H>$ calculation cannot be performed, and it is necessary to increase the number of available peaks by a method, for example, increasing the number of integration times. With using the maximum value, the minimum value, and the average value of $T_{1\rho}H$ obtained as above, $\Delta T_{1\rho}H/<T_{1\rho}H>$ can be calculated by the following formula.

$$\Delta T_{1\rho}H/<T_{1\rho}H> = [(\text{maximum value of } T_{1\rho}H) - (\text{minimum value of } T_{1\rho}H)]/(\text{average value of } T_{1\rho}H)$$

As the copolymers, exemplified are a poly fluorene type copolymer, polyarylene type copolymer, polyarylene vinylene type copolymer, polystilbene type copolymer, polystilbene vinylene type copolymer, poly pyridinediyl type copolymer, alkoxy polythiophene type copolymer, etc., provided that $\Delta T_{1\rho}H/<T_{1\rho}H>$ is in the range of the above numerical values. A poly fluorene type copolymer, polyarylene type copolymer, polyarylene vinylene type copolymer, polystilbene type copolymer, and polystilbene vinylene copolymer are preferable. A polyfluorene type copolymer is especially preferable.

As the method for obtaining the copolymer having $\Delta T_{1\rho}H/<T_{1\rho}H>$ of the above-mentioned numerical value, exemplified are, for example: a method of copolymerizing monomers resembled closely each other in the solubility to a polymerization solution or in the independent rate of polymerization; a method of adjusting the charging of each monomer into a polymerization liquid, or charging it independently; a method of controlling the catalyst amount/polymerization temperature so that the copolymer has a single molecular weight distribution curve; a method of using a solvent having the similar solubility at a temperature lower than the boiling point by 10° C. with that of the monomer to be copolymerized; a method of using a solvent having 50 ppm or less of moisture content as a polymerization solvent; a method wherein the polymerization temperature is set to a temperature lower than the boiling point of the solvent by 10° C.; a method of reducing the oxygen concentration below 0.1% by replacing the inner system with nitrogen; a method of copolymerization by random copolymerization; a method of using a zero-valent nickel complex as a polymerization catalyst; a method of copolymerizing monomers having the same or similar kinds of substituents; a method of copolymerizing monomers having the same number of substituents; and a method of copolymerizing monomers satisfying the following conditions, the numbers of carbon atoms of the substituents are the same, or (number of carbon atoms in the substituent having more carbon atoms than the other)<2×(number of carbon atoms in the substituent having less carbon atoms).

The copolymers of the present invention [1], [2], and [3] have a polystyrene reduced number average molecular weight of $10^3$–$10^8$ and the total number of repeating structures thereof changes also with the repeating structure or the rate thereof. When the total number of the repeating structure is too small, the device using thereof tends to have insufficient characteristics, such as luminance and life time. When the total number is too large, the film-forming property tends to become worse. The number of the total of repeating structure is preferably 20–10000, more preferably 30–10000, and especially preferably 50–5000.

Moreover, since light emitting property and life time as a device may be deteriorated when a polymerizable group remains as an end group of the copolymer, the end group of the copolymer of the present invention [1], [2], and [3] may be protected by a stable group. Those having a conjugation bond continuing to a conjugated structure of the main chain are preferable, and exemplified are structures connecting to an aryl group or a heterocyclic compound group through a vinylene group. Concretely, substituents represented by Chemical Formula 10 described in JP-A No. 9-45478, and the like are exemplified.

The copolymer of the present invention [1], [2], and [3] may also be a random, block or graft copolymer, or a polymer having an intermediate structure thereof, for example, a random copolymer having block property. Also included are those having a branching in the main chain and three or more terminal parts, and dendolimers.

As the copolymer of the present invention, a random copolymer is preferable in view of solubility and glass transition temperature. The random copolymer is defined as a copolymer in which different kinds of monomer molecules are arranged at random in a polymer main chain (McGraw-Hill, Dictionary of Scientific and Technical Terms, 3rd Edition). For example, when 3 kinds of monomers, A, B, and C, are polymerized, 6 kinds of sequences, A-A, A-B, A-C, B-B, B-C, C-C, are considered to be generated.

The copolymer of the present invention [1], [2], and [3] may contain repeating units other than the repeating unit represented by formula (1), formula (2), or formula (3) within a range of not injuring fluorescence characteristics or charge transportation characteristics. Moreover, the repeating units represented by a formula (1), a formula (2), or a formula (3), and the other repeating unit may be connected with a non-conjugated unit. The non-conjugated portion thereof may be contained in the repeating units. As the connected structures, exemplified are the groups shown below, the combination of a group shown below and vinylene group, and the combination of two or more of the groups shown below. Here, R is a hydrogen atom, an alkyl group having 1–20 carbon atoms, an aryl group having 6–60 carbon atoms, or a heterocyclic group having 4–60 carbon atoms. Ar shows a hydrocarbon group having 6–60 carbon atoms.

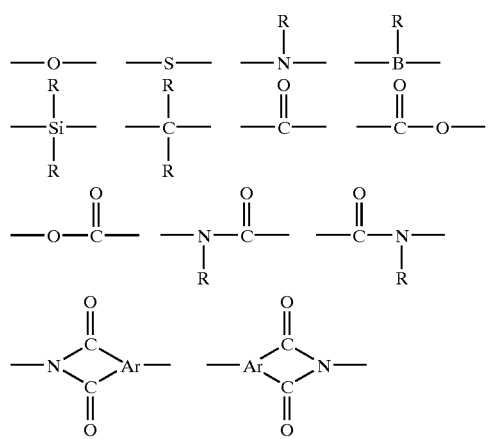

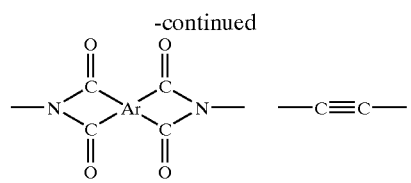

As a good solvent to the copolymer of the present invention, exemplified are chloroform, methylene chloride, dichloroethane, tetrahydrofuran, toluene, xylene, mesitylene, tetralin, decalin, n-butylbenzene, etc. Depending also on the structure and the molecular weight, the copolymer can be dissolved, usually, in a concentration of 0.1% by weight or more in these solvents.

As for the glass transition temperature of the copolymer of the present invention, it is preferably as high as possible. When the glass transition temperature is low, the copolymer tends to be easily denatured. Therefore, the glass transition temperature is preferably more than 50° C., more preferably more than 80° C., and further preferably more than 100%, and especially preferably more than 150° C.

Moreover, since luminescence from a thin film is used, as a copolymer of the present invention, those exhibiting fluorescence in the solid state are used preferably.

As the synthetic process of the copolymer of the present invention [1], [2], and [3], exemplified are, for example, a method of polymerization by Suzuki coupling reaction from the corresponding monomer (Chem. Rev. volume 95, page 2457 (1995)); a method of polymerization by Grignard reaction; a method of polymerization by Yamamoto polymerizing method (Prog. Polym. Sci. volume 17, pages 1153–1205 (1992); a method of polymerization by oxidizing agent, such as $FeCl_3$; a method of electrochemical oxidation polymerization; a method of decomposition of an intermediate polymer having an appropriate leaving group; etc. As the random polymerizing method (a method capable of giving a random copolymer), Yamamoto polymerization method, a method of polymerizing by Grignard reaction, a method of polymerizing by oxidizing agents, such as the and $FeCl_3$, a method of electrochemical oxidation polymerization, are exemplified. Among them, It is especially preferable to polymerize by the Yamamoto polymerization method. In the Yamamoto polymerization method, usually a zero-valent nickel complex is used, and a halide is reacted in an ether solvent, such as tetrahydrofuran, and 1,4-dioxane, or an aromatic hydrocarbon solvent, such as toluene. As the zero-valent nickel complex, exemplified are bis(1,5-cyclo octadiene)nickel(0), (ethylene)bis(triphenylphosphine) nickel(0), tetrakis(triphenylphosphine) nickel, etc., and bis (1,5-cyclo octadiene)nickel(0) is preferable.

In this case, it is preferable to add a neutral ligand, in view of improvement in yield, high molecular weight polymerization.

The neutral ligand is a ligand which has neither an anion nor a cation, and exemplified are: nitrogen-containing ligands, such as 2,2'-bipyridyl, 1,10-phenanthroline, methylenebisoxazoline, and N,N'-tetramethylethylenediamine; and tertiary phosphine ligands, such as triphenyl phosphine, tritolyl phosphine, tributyl phosphine, and triphenoxy phosphine, etc. The nitrogen-containing ligand is preferable in view of versatility and cheapness, and 2,2'-bipyridyl is especially preferable in view of high reactivity and high yield.

When using a neutral ligand, in view of reaction yield and cost, the using amount is preferably about 0.5–10moles based on the zero-valent nickel complex, and more preferably 0.8–1.5 moles, and further preferably 0.9–1.1 moles.

Especially, in order to increase the molecular weight of polymer, a system in which 2,2'-bipyridyl is added as a neutral ligand to a system containing bis(1,5-cyclo octadiene)nickel(0) is preferable.

The amount of zero-valent nickel complex is not especially limited as long as the polymerization reaction is not inhibited.

When the amount is too little, the molecular weight tends to become small, and when it is too large, the post-treatment tends to become complicated.

Therefore, it is preferably 0.1–10moles based on one mole of monomers, more preferably 1–5 moles, and further preferably 2–3.5 moles.

When the copolymer of the present invention is used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis. In addition, the copolymer of the present invention can be used as not only a light-emitting material but also an organic semiconductor material, an optical material, and a conductive material by doping.

Next, the polymer composition of the present invention will be explained.

The polymer composition of the present invention [4] comprises a polymer having a polystyrene reduced number average molecular weight of $10^3$–$10^8$ and exhibiting fluorescence in the solid state, and the copolymer of the present invention [1] and/or [2]. Any polymers can be used as the polymer, which improve the solubility in a solvent, the glass transition temperature, and the characteristics of device, such as life time, luminance, etc. Specifically, as the polymer compounds exemplified are those described in JP-A No. 2001-247861, JP-A No. 2001-507511, JP-A No. 2001-504533, JP-A No. 2001-278958, JP-A No. 2001-261796, JP-A No. 2001-226469, and JP patent 3161058. As the kind of the polymer compounds, exemplified are a poly fluorene type compound, a polyfluorene type copolymer, a polyarylene type compound, a polyarylene type copolymer, a polyarylenevinylene type compound, a polyarylenevinylene type copolymer, a polystilbene type compound, a polystilbene type copolymer, a polystilbenevinylene type compound, a poly stilbenevinylene type copolymer, a polypyridinediyl type compound, a polypyridinediyl type copolymer, an alkoxypolythiophene type compound, an alkoxypolythiophene type copolymer, etc. A polyfluorene type copolymer, a polyarylene type copolymer, a polyarylenevinylene type copolymer, a polystilbene type copolymer, and a poly stilbene vinylene copolymer are preferable.

The mixing ratio is not especially limited as long as the solubility in a solvent, the glass transition temperature, and the characteristics of device, such as life time, luminance, etc. are improved.

The ratio of the copolymer of the present invention [1] and/or [2] based on the whole polymer composition is preferably 40–95% by weight, more preferably 50–80% by weight, and most preferably 65–75% by weight.

Among them, those having the below described $\Delta T_{1\rho}H/\langle T_{1\rho}H\rangle$ of 0.35 or less is preferable.

The polymer composition of the present invention [5] comprises the copolymer of the present invention [1], and the copolymer of the present invention [2]. Thereby, it can be possible to improve the solubility in a solvent, the glass transition temperature, and the characteristics of the devices, such as life time, luminance, etc. The repeating unit of formula (1) and the repeating unit of formula (2) may be mutually the same or different in the copolymer [1] and the copolymer [2] of the present invention. Among them, those having the below $\Delta T_{1\rho}H/\langle T_{1\rho}H\rangle$ of 0.35 or less is preferable.

The polymer composition of the present invention [6] comprises two or more kinds of polymer compounds having a polystyrene reduced number average molecular weight of $10^3$–$10^8$, and exhibiting fluorescence in the solid state. When $T_{1\rho}H$ is measured by $^{13}C$ nuclear magnetic resonance with carrying out high-speed rotation of the film of the polymer composition around a magic angle in solid nuclear magnetic resonance, $T_{1\rho}H/\langle T_{1\rho}H\rangle$ is 0.35 or less. $\Delta T_{1\rho}H/\langle T_{1\rho}H\rangle$ is preferably 0.30 or less, more preferably 0.15 or less.

When $\Delta T_{1\rho}H/\langle T_{1\rho}H\rangle$ is outside the above-mentioned range, the film obtained with using said polymer composition may be made cloudy.

$\Delta T_{1\rho}H/\langle T_{1\rho}H\rangle$ can be obtained by using a polymer composition instead of the copolymer in $\Delta T_{1\rho}H/\langle T_{1\rho}H\rangle$ in the above-mentioned present invention [3].

As the polymer compounds, exemplified are a polyfluorene type compound, a polyfluorene type copolymer, a polyarylene type compound, a polyarylene type copolymer, a polyarylenevinylene type compound, a polyarylenevinylene type copolymer, a poly stilbene type compound, a polystilbene type copolymer, a polystilbenevinylene type compound, a polystilbenevinylene type copolymer, a polypyridinediyl type compound, a poly pyridinediyl type copolymer, an alkoxypolythiophene type compound, an alkoxypolythiophene type copolymer, etc. A polyfluorene type copolymer, a polyarylene type copolymer, a polyarylene vinylene type copolymer, a polystilbene type copolymer, and a polystilbenevinylene copolymer are preferable.

As the methods for obtaining the polymer composition having the range of the above-mentioned numerical values, from two kinds or more of these, exemplified are: a method of mixing polymer compounds having the similar molecular weight distributions; a method of mixing polymer compounds having the similar monomer structures; a method of mixing polymer compounds having the same or similar kinds of substituents; a method of mixing with using a solvent which dissolves the polymer compounds in high solubility; a method of mixing with stirring; a method of mixing polymer compounds whose difference of the weight average molecular weights is about $1.0\times10^5$ or less; a method of mixing polymer compounds such that the maximum weight average molecular weight of respective polymer compounds used for mixing does not exceed a hundredfold of the minimum weight average molecular weight thereof. The method is appropriately selected according to the polymer compounds to be mixed.

Next, the polymer LED of the present invention will be described. The polymer LED of the present invention is a polymer light emitting diode, comprising at least a light-emitting layer between electrodes consisting of an anode and a cathode, and the copolymer or the polymer composition of the present invention is contained in the light-emitting layer.

As the polymer LED of the present invention, there are exemplified polymer LEDs comprising an electron transporting layer disposed between a cathode and a light emitting layer, polymer LEDs comprising a hole transporting layer disposed between an anode and a light emitting layer, polymer LEDs comprising an electron transporting layer disposed between a cathode and a light emitting layer and having a hole transporting layer disposed between an anode and a light emitting layer.

As the polymer LED of the present invention, also included are polymer LEDs comprising a layer containing a conductive polymer disposed at least between one electrode and a light emitting layer such that the layer containing a conductive polymer is adjacent to the electrode; and polymer LEDs comprising an insulation layer having a thickness of 2 nm or less disposed at least between one electrode and a light emitting layer such that the insulation layer is adjacent to the electrode.

For example, the following structures a) to d) are specifically exemplified.

a) anode/light emitting layer/cathode b) anode/hole transporting layer/light emitting layer/cathode c) anode/light emitting layer/electron transporting layer/cathode d) anode/hole transporting layer/light emitting layer/electron transporting layer/cathode (wherein, "/" indicates adjacent lamination of layers. Hereinafter, the same).

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer. The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode f) anode/light emitting layer/charge injecting layer/cathode g) anode/charge injecting layer/light emitting layer/charge injecting layer/cathode h) anode/charge injecting layer/hole transporting layer/light emitting layer/cathode i) anode/hole transporting layer/light emitting layer/charge injecting layer/cathode j) anode/charge injecting layer/hole transporting layer/light emitting layer/charge injecting layer/cathode k) anode/charge injecting layer/light emitting layer/electron transporting layer/cathode l) anode/light emitting layer/electron transporting layer/charge injecting layer/cathode m) anode/charge injecting layer/light emitting layer/electron transporting layer/charge injecting layer/cathode n) anode/charge injecting layer/hole transporting layer/light emitting layer/electron transporting layer/cathode o) anode/hole transporting layer/light emitting layer/electron transporting layer/charge injecting layer/cathode p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 $\mu$m, preferably from 2 nm to 500 nm, further preferably from 5 nm to 200 nm.

In the polymer LED of the present invention, light emitting materials other than the above-described polymeric fluorescent substance can also be mixed in a light emitting layer. Further, in the polymer LED of the present invention, the light emitting layer containing light emitting materials other than-the above-described polymeric fluorescent substance may also be laminated with a light emitting layer containing the above-described polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property.

Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 μm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that the anode of an electrode consisting of an anode and a cathode is transparent or semitransparent.

As the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium•tin•oxide (ITO), indium•zinc•oxide and the like, which are metal oxide complexes, and gold, platinum, silver, copper and the like are used, and among them, ITO, indium•zinc•oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 $\mu$m, preferably from 20 nm to 1 $\mu$m, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

The polymer LED of the present invention can be used for a flat light source, a segment display, a dot matrix display, and a liquid crystal display as a back light, etc.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

In the method for evaluating a solubility of a copolymer exhibiting fluorescence in the solid state in an organic solvent, $\Delta T_{1\rho}H/<T_{1\rho}H>$ is used, which is obtained by measuring $T_{1\rho}H$ by $^{13}C$ nuclear magnetic resonance with carrying out high-speed rotation of the film of the copolymer around a magic angle in solid nuclear magnetic resonance. The smaller $\Delta T_{1\rho}H/<T_{1\rho}H>$ is, the larger the solubility in an organic solvent. Thereby, the solubility in an organic solvent of a copolymer exhibiting fluorescence in the solid state can be evaluated numerically.

In the method for evaluating a homogeneity of a film of a polymer composition consisting of two or more kinds of polymer compounds exhibiting fluorescence in the solid state, and having a polystyrene reduced number average molecular weight of $10^3$–$10^8$, $\Delta T_{1\rho}H/<T_{1\rho}H>$ is used, which is obtained by measuring $T_{1\rho}H$ by $^{13}C$ nuclear magnetic resonance with carrying out high-speed rotation of the film of the copolymer around a magic angle in solid nuclear magnetic resonance.

The smaller $\Delta T_{1\rho}H/<T_{1\rho}H>$ is, the better the homogeneity is.

Thereby, the homogeneity of a film of a polymer composition consisting of two or more kinds of polymer compounds exhibiting fluorescence in the solid state, and having a polystyrene reduced number average molecular weight of $10^3$–$10^8$, can be evaluated numerically.

EXAMPLES

The following examples further illustrate the present invention in detail but do not limit the scope thereof.

Here, regarding the weight-average molecular weight and number-average molecular weight, the polystyrene reduced number average molecular weight was determined by gel permeation chromatography (GPC: HLC-8220GPC made by TOSOH or SCL-10A by Shimadzu Corp.) using chloroform as a solvent. The glass transition point was determined by DSC (DSC2920, made by TA Instruments).

$T_{1\rho}H$ was measured in a room temperature using CMX-300 type apparatus made by Chemagnetics Inc.

Example 1
<Synthesis of Copolymer 1>
2,7-dibromo-9,9-dioctylfluorene (250 mg, 0.456 mmol), 2,7-dibromo-9,9-diisopentylfluorene (212 mg, 0.457 mmol), N,N'-bis(4-bromophenyl)-N,N'-(bis-4-n-butylphenyl)-1,4- phenylenediamine (270 mg, 0.397 mmol, and 2,2'-bipyridyl (509 mg, 3.26 mmol) were dissolved in tetrahydrofuran (dehydrated) 40 mL, and the inside of the system was replaced with nitrogen gas by bubbling with nitrogen gas. Under nitrogen atmosphere, bis(1,5-cyclooctadiene)nickel (0) {Ni(COD)$_2$} (896 mg, 3.26 mmol) was added to this solution, and the temperature was raised to 60° C. to conduct the reaction for 3 hours with stirring. After the reaction, the reaction liquid was cooled to a room temperature (about 25° C.), and added dropwise in a mixed solution of 25% aqueous-ammonia 10 mL/methanol 120 mL/ion-exchanged water 50 mL, and stirred for 1 hour. The deposited precipitate was filtrated and dried under reduced pressure for 2 hours, and dissolved in toluene 30 mL. Then, 1N hydrochloric acid 30 mL was added, and stirred for 1 hour, the aqueous layer was removed, 4% aqueous ammonia 30 mL was added to the organic layer, and after stirring for 1 hour, the aqueous layer was removed. The organic layer was added dropwise to methanol 200 mL, stirred for 1 hour, and the deposited precipitate was filtrated and dried under reduced pressure for 2 hours, and dissolved in toluene 30 mL. Then, purification was performed through alumina column (20 g of alumina), the collected toluene solution was added dropwise to methanol 250 mL, stirred for 1 hour, and the deposited precipitate was filtrated and dried under reduced pressure for 2 hours. Copolymer 1 was obtained in yield of 269.8 mg. From the charging ratio of monomers, the ratio of the repeating units of formula (4), formula (5), and formula (6) in Copolymer 1 is 35:35:30.

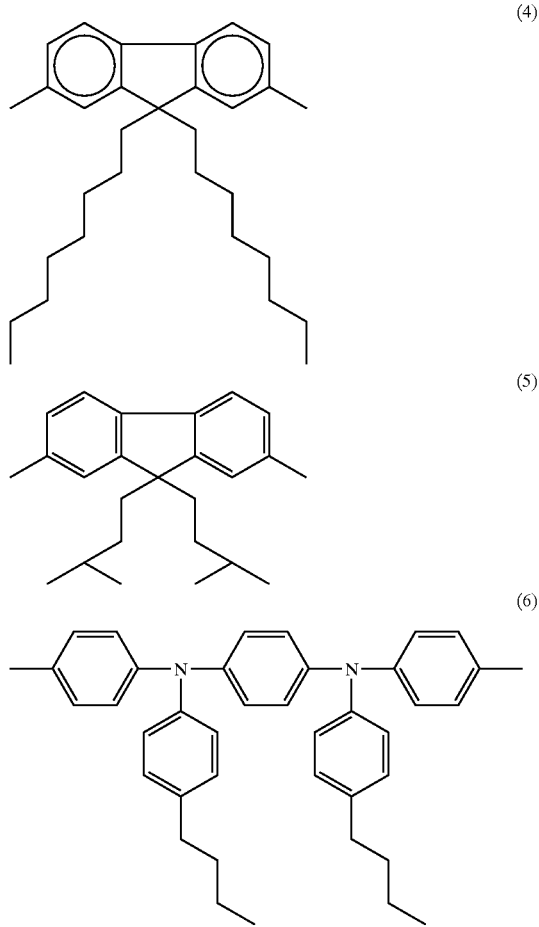

The polystyrene reduced average molecular weights of Copolymer 1 were, Mn=2.0×10$^4$, and Mw=5.5×10$^4$. Copolymer 1 was easily soluble in solvents, such as toluene and chloroform.

Example 2

<Synthesis of Copolymer 2>

2,7-dibromo-9,9-dioctylfluorene (26.32 g, 0.0480 mol), 2,7-dibromo-9,9-diisopentylfluorene (5.6 g, 0.0121 mol), and 2,2'-bipyridyl (22 g, 0.141 mol) were dissolved in tetrahydrofuran (dehydrated) 1600 mL, and the inside of the system was replaced with nitrogen gas by bubbling with nitrogen gas. Under nitrogen atmosphere, bis(1,5-cyclooctadiene)nickel(0) {Ni(COD)$_2$} (40.01 g, 0.145 mol) was added to this solution, and the temperature was raised to 60° C. to conduct the reaction for 8 hours. After the reaction, the reaction liquid was cooled to a room temperature (about 25° C.), and added dropwise in a mixed solution of 25% aqueous-ammonia 200 mL/methanol 1200 mL/ion-exchanged water 1200 mL, and stirred for 30 minutes. The deposited precipitate was filtrated and dried in air. Then, it was dissolved in toluene 1100 mL and filtrated. The filtrate was added dropwise to methanol 3300 mL, and stirred for 30 minutes. The deposited precipitate was filtrated and washed with methanol 1000 mL, then it was dried under reduced pressure for 5 hours. Copolymer 2 was obtained in yield of 20.47 g. From the charging ratio of monomers, the ratio of the repeating units of formula (4), and formula (5) in Copolymer 2 is 80:20.

The polystyrene reduced average molecular weights of Copolymer 2 were, Mn=6.0×10$^4$, and Mw=1.5×10$^5$. Copolymer 2 was easily soluble in solvents, such as toluene and chloroform.

Synthetic Example 1

<Synthesis of Polymer Compound 3>

2,7-dibromo-9,9-dioctylfluorene (5.8 g, 10.6 mmol), N,N'-bis(4-bromophenyl)-N,N'-(bis-4-n-butylphenyl)-1,4-phenylenediamine (3.1 g, 4.54 mmol), and 2,2'-bipyridyl (5.5 g, 35.2 mmol) were dissolved in tetrahydrofuran (dehydrated) 40 mL, and the inside of the system was replaced with nitrogen gas by bubbling with nitrogen gas. Under nitrogen atmosphere, bis(1,5-cyclooctadiene)nickel (0) {Ni(COD)$_2$} (10.0 g, 36.4 mmol) was added to this solution, and the temperature was raised to 60° C. to conduct the reaction for 3 hours with stirring. After the reaction, the reaction liquid was cooled to a room temperature (about 25° C.), and added dropwise in a mixed solution of 25% aqueous-ammonia 80 mL/methanol 300 mL/ion-exchanged water 300 mL, and stirred. The deposited precipitate was filtrated and dried under reduced pressure for 2 hours, and dissolved in toluene 50 mL at 50° C. Then, purification was performed through silica-alumina column, the collected toluene solution wa added dropwise to methanol and stirred, and the deposited precipitate was filtrated and washed with ethanol, and dried under reduced pressure. Polymer Compound 3 was obtained in yield of 3.4 g. From the charging ratio of monomers, the ratio of the repeating units of formula (4) and formula (6) in Polymer Compound 3 is 70:30.

The polystyrene reduced average molecular weights of Polymer Compound 3 were, Mn=2.2×10$^4$, and Mw=9.2×10$^4$. Polymer Compound 3 was hardly soluble in solvents, such as toluene and chloroform, but soluble in toluene and chloroform, with stirring at 50° C.

Example 3

<Preparation of Polymer Composition 4>

The above Copolymer 2 and Polymer Compound 3 were used, and 1.5% by weight toluene solutions for each of them were prepared. Using each toluene solution, Polymer Composition 4 was prepared by mixing them so as to make Copolymer 2: Polymer Compound 3=69:31.

Synthetic Example 2
<Synthesis of Polymer Compound 5>

Under nitrogen atmosphere, 9,9-dioctylfluorene-2,7-bis (ethyleneboronate) (305 mg, 0.575 mmol), 2,7-dibromo-9,9-dioctylfluorene (287 mg, 0.523 mmol), and aliquat336 (15 mg, 0.037 mmol) were dissolved in toluene (4.3 g), to which 1.0 g of aqueous solution of potassium carbonate (231 mg, 1.67 mmol) was added. Further, tetrakis (triphenylphosphine)palladium (4 mg, 0.0035 mmol) was added, and the temperature was raised to 110° C. to conduct the reaction for 20 hours, with stirring. Then, bromobenzene (14 mg, 0.0892 mmol) dissolved in toluene 0.1 mL was added to the reaction liquid, and stirred at 110° C. for 5 hours. After cooling to 50° C., the organic layer was added dropwise in methanol/water (1/1), and was stirred for 1 hour. The precipitate was filtrated, washed with using methanol and ion-exchanged water, and dried under reduced pressure. Then, it was dissolved in toluene 50 mL and purified through silica column (amount of silica, 15 mL). The solution after purification was added dropwise to methanol, stirred for 1 hour, and the precipitate was filtrated, and dried under reduced pressure to obtain Polymer Compound 5. Polymer Compound 5 was obtained in yield of 340 mg. Polymer Compound 5 is a polymer consisting of the repeating unit of formula (4).

The polystyrene reduced average molecular weights of Polymer Compound 5 were, Mn=1.2×10$^4$, Mw=3.2×10$^4$. Polymer Compound 5 was hardly soluble in solvents, such as toluene and chloroform, but could be dissolved by heating to 50° C. with stirring.

Synthetic Example 3
<Synthesis of Polymer Compound 6>

2,7-dibromo-9,9-diisobutylfluorene (0.93 g, 2.00 mmol) and 2,2'-bipyridyl (0.69 g, 4.42 mmol) were dissolved in tetrahydrofuran (dehydrated) 60 mL, and the inside of the system was replaced with nitrogen by bubbling with nitrogen gas. Under nitrogen atmosphere, bis(1,5-cyclooctadiene) nickel(0) {Ni(COD)$_2$} (1.2 g, 4.36 mmol) was added to this solution, and temperature was raised to 60° C. to conduct the reaction for 7 hours, with stirring. After the reaction, this reaction liquid was cooled to a room temperature (about 25° C.), and added dropwise in a mixed solution of 25% aqueous ammonia 20 mL/methanol 150 mL/ion-exchanged water 100 mL, and stirred for 1 hour. The deposited precipitate was filtrated, and dried under reduced pressure, and then dissolved in chloroform. Then, it was added dropwise to methanol, and stirred, the deposited precipitate was filtrated, washed with acetone, and dried under reduced pressure to give Polymer Compound 6. The yield of Polymer Compound 6 was 350 mg. From the charging ratio of monomers, Polymer Compound 6 is a polymer consisting of the repeating unit of formula (5).

The polystyrene reduced average molecular weights of Polymer Compound 6 were, and Mn=7.3×10$^4$, Mw=3.5×10$^5$.

Synthetic Example 4
<Synthesis of Polymer Compound 7>

1,4-dibromo-2,5-di(3,7-dimethyloctyloxy)benzene (6.17 g, 11.3 mmol), N,N'-bis(4-bromo-3-methyl-phenyl)-N,N'-biphenyl benzidine (2.53 g, 3.75 mmol), and 2,2'-bipyridyl (5.50 g, 35.2 mmol) were dissolved in tetrahydrofuran (dehydrated) 400 mL, and the inside of the system was replaced with nitrogen gas by bubbling with nitrogen. Under nitrogen atmosphere, bis(1,5-cyclooctadiene)nickel(0) {Ni(COD)$_2$} (9.6 g, 34.9 mmol) was added to this solution, and the temperature was raised to 60° C. to conduct the reaction for 8 hours, with stirring. After the reaction, the reaction liquid was cooled to a room temperature (about 25° C.), and added dropwise in a mixed solution of 25% aqueous-ammonia 100 mL/methanol 1.0L/ion-exchanged water 500 mL, and stirred for 30 minutes. The deposited precipitate was filtrated, dried under reduced pressure, and dissolved in chloroform 500 mL. Then, filtration was performed, and the filtrate was condensed to about 50 mL with using a rotating evaporator, and added dropwise in methanol 900 mL with stirring. The deposited precipitate was filtrated and dried under reduced pressure. Furthermore, it was dissolved in toluene 200 mL, filtered again, and the filtrated solution was condensed to about 50 mL with using a rotating evaporator, and added dropwise in methanol 900 mL, and stirred for 30 minutes, then the deposited precipitate was filtrated and dried under reduced pressure to give Polymer Compound 7. The yield of Polymer Compound 7 was 3.2 g. From the charging ratio of monomers, the ratio of the repeating unit of formula (7) and formula (8) in Polymer Compound 7 is 75:25.

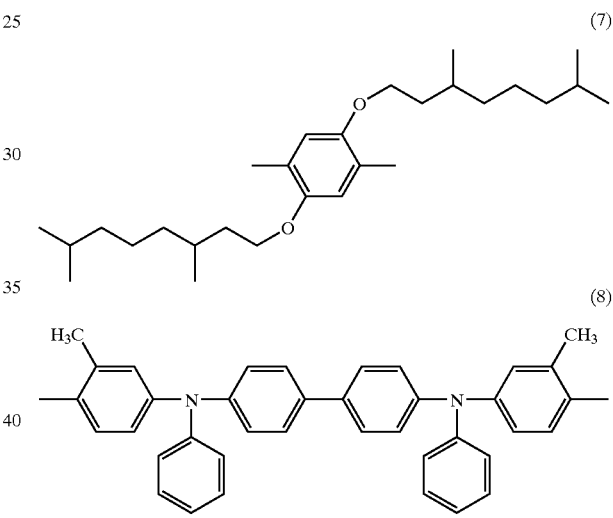

The polystyrene reduced average molecular weights of this polymer compound 7 were, Mn=1.4×10$^4$, and Mw=1.1×10$^5$.

Synthetic Example 5
<Synthesis of Copolymer 8>

2,7-dibromo-9,9-dioctylfluorene (5.5 g, 0.0100 mol), 2,7-dibromo-9,9-diisopentylfluorene (4.6 g, 0.0100 mol), and 2,2'-bipyridyl (6.9 g, 0.044 mol) were dissolved in tetrahydrofuran (dehydrated) 1600 mL, and the inside of the system was replaced with nitrogen gas by bubbling with nitrogen. Under nitrogen atmosphere, bis(1,5-cyclooctadiene)nickel (0) {Ni(COD)$_2$} (12 g, 0.044 mol) was added to this solution, and the temperature was raised to 60° C. to conduct the reaction for 7 hours. After the reaction, the reaction liquid was cooled to a room temperature (about 25° C.), and added dropwise in a mixed solution of 25% aqueous-ammonia 100 mL/methanol 1800 mL/ion-exchanged water 1800 mL, and stirred for 30 minutes. The deposited precipitate was filtrated and dried under reduced pressure for 2 hours, and dissolved in toluene 550 mL. Then, 1N hydrochloric acid 400 mL was added, and stirred for 1 hour, the aqueous layer was removed, 4% aqueous ammonia 400 mL was added to the organic layer, and after stirring for 1 hour, the aqueous layer was removed. The organic layer was added dropwise to methanol, stirred for 1 hour, and the deposited precipitate was filtrated and dried under reduced pressure for 2 hours. The yield of Copolymer 8 was 3.5 g. From the charging ratio of monomers, the ratio of the repeating unit of formula (4) and formula (5) in a copolymer 8 is 50:50.

The polystyrene reduced average molecular weights of this copolymer 8 were, Mn=5.3×10$^4$, and Mw=1.4×10$^5$. Copolymer 8 was insoluble in solvents, such as toluene and chloroform, but could be dissolved in toluene and chloroform by heat to 50° C. with stirring.

Preparative Example 1
<Preparation of Polymer Composition 9>

The above Copolymer 8 and Polymer Compound 7 were used, and 1.5% by weight toluene solutions for each of them were prepared. Using each toluene solution, Polymer Composition 9 was prepared by mixing them so as to make Copolymer 8:Polymer Compound 7=50:50.

Example 4
<Production of Device, and Evaluation of Life Time>

A film was formed in a thickness of 50 nm with spin coating using a solution of poly(ethylenedioxythiophene)/polystyrenesulfonic acid (Baytron, produced by Bayer AG.), on a glass substrate attached with ITO film by sputtering method of 150 nm thickness, and dried for 10 minutes at 120° C. on a hot plate. Next, film forming was carried out in a thickness of about 70 nm with spin coating using 1.5 wt % toluene solution of Polymer Composition 4. Furthermore, after drying this under reduced pressure at 80° C. for 1 hour, lithium fluoride was deposited in 0.4 nm as a cathode buffer layer, and as a cathode, calcium in 25 nm, and subsequently aluminum in 40 nm were deposited, to produce a polymer LED. All the degree of vacuum at the time of deposition were 1–8×10$^{-6}$ Torr.

A device was taken out from the deposition apparatus, immediately moved into a glove box of nitrogen atmosphere, and sticked together with a glass substrate coated with UV hardening resin (World Rock 8723K3, produced by Kyoritsu Chemical Industries) on the periphery, and then irradiated with UV light for 1 minute to seal the device.

By applying a constant electric current of current density 16 mA/cm$^2$ to the resulting device, the initial luminance 100 cd/m$^2$ was halved in 800 hours.

Comparative Example 1
<Production of Device, and Evaluation of Life Time>

For Polymer Compound 3, a device was produced as the same manner with Example 4. By applying a constant electric current of current density 16 mA/cm$^2$ to the resulting device, the initial luminance 100 cd/m$^2$ was halved in 350 hours.

From Example 4 and Comparative Example 1, a copolymer containing the repeating units of formula (1) and formula (2) or a polymer composition containing said copolymer has a longer life time than a copolymer containing either one of the repeating unit of formula (1) or formula (2).

Example 5
<Solubility in Solvent>

A sample (Copolymer 2, Polymer Compound 5, or Polymer Compound 6) and toluene (1 ml toluene per about 10 mg of sample) were contacted.

Copolymer 2 was dissolved in toluene at a room temperature (about 25° C.), in a few minutes, without stirring.

On the other hand, Polymer Compound 5 was gelled at a room temperature (about 25° C.), and could be dissolved with stirring at 50° C. for about 10 minutes.

Polymer Compound 6 could not be dissolved in toluene, even with stirring at 50° C. for about 10 minutes.

From these results, the polymer containing formula (1) and formula (2) as the repeating unit has a high solubility in a solvent and a high stability of the solution.

Example 6
<Film Production>

Films were produced with using Copolymer 2, Polymer Compound 5, and Polymer Compound 6. The films were formed in a thickness of about 70 nm by spin coating with using 1.5 wt % toluene solution of the copolymer or the polymer compounds. A uniform film could be formed when Copolymer 2 was used, but when Polymer Compound 5 was used, the toluene solution was gelled to give a nonuniform film. Moreover, when Polymer Compound 6 was used, a nonuniform film was obtained.

Example 7
<Measurement of Glass Transition Temperature>

The glass transition temperatures of Copolymer 2, Polymer Compound 5, and Polymer Compound 6 were measured using DSC. The glass transition temperatures of Copolymer 2, Polymer Compound 5, and Polymer Compound 6 were, respectively, 85° C., 73° C., and 134° C.

Example 8
<$T_{1\rho}H$ Measurement of Polymer Composition 4>

About 0.03 g of Polymer Composition 4 was dissolved in 2 ml toluene at a room temperature, dropped on a sheet of Teflon (registered trademark), and a cast film was prepared. The film was dried under reduced pressure, overnight, in order to remove the solvent, put into a sample tube for measurement having outer diameter of 7 mm, inserted in apparatus, and measured with rotating 5000 volutions per second.

The observation center frequency of proton nucleus was 299.91 MHz, the observation center frequency of $^{13}C$ nucleus was 75.42 MHz, and the observation width of the nuclear magnetic resonance spectrum of $^{13}C$ was set to 30 kHz. The 90° pulse width used for polarization transfer was set to 5 micro-seconds for both of the proton nucleus and $^{13}C$ nucleus, and the contact time was set to 1 ms. For the spin lock time of the proton nucleus for $T_{1\rho}H$ calculation, 11 values from 1 is to 20 ms were set. That is, 1 µs, 50 µs, 100 µs, 500 µs, 1 ms, 2 ms, 4 ms, 7 ms, 10 ms, 15 ms, and 20 ms were set as the spin lock time. Integration was conducted 2048 times about each spin lock time, and the repeating time of integration was set to 5 seconds.

In $T_{1\rho}H$ obtained by least squares method calculation from the peak strengths of $^{13}C$ nuclear magnetic resonance spectrum obtained in the above different spin lock time of 11 points, when the peak strength of the shortest spin lock time case is less than 8 times of the noise level, variation of $T_{1\rho}H$ by noise is generated, accordingly the case is omitted from the calculation of $\Delta T_{1\rho}H/<T_{1\rho}H>$. Namely, the peaks used for calculation of $\Delta T_{1\rho}H/<T_{1\rho}H>$ were nine peaks, 151.87 ppm, 140.78 ppm, 126.78 ppm, 120.56 ppm, 55.62 ppm, 41.04 ppm, 30.34 ppm, 23.34 ppm, and 14.59 ppm in the chemical shift from methyl carbon of tetramethylsilane as 0 ppm. In addition, as the above noise, the standard deviation of the relaxation curve obtained by a least squares method from the data and the actual data is used. $\Delta T_{1\rho}H/<T_{1\rho}H>$ calculated from $T_{1\rho}H$ obtained by these peaks was 0.10.

<$T_{1\rho}H$ Measurement of Polymer Composition 9>

The measurement was conducted as the same manner as above, except that 0.03 g of Polymer Composition 9 was used.

$T_{1\rho}H$ was obtained by least squares method calculation from the peak strengths of $^{13}C$ nuclear magnetic resonance spectrum obtained in the above different spin lock time of 11 points. Among them, when the peak strength of the shortest spin lock time case is less than 8 times of the noise level, variation of $T_{1\rho}H$ by noise is generated, accordingly the case was omitted from the calculation of $\Delta T_{1\rho}H/<T_{1\rho}H>$. Namely, the peaks used for calculation of $\Delta T_{1\rho}H/<T_{1\rho}H>$ were ten peaks, 151.67 ppm, 147.39 ppm, 140.98 ppm, 127.17 ppm, 120.76 ppm, 56.01 ppm, 39.87 ppm, 29.17 ppm, 23.34 ppm, and 14.79 ppm in the chemical shift from methyl carbon of tetramethylsilane as 0 ppm. In addition, as the above noise, the standard deviation of the relaxation curve obtained by a least squares method from the data and the actual data is used. $\Delta T_{1\rho}H/<T_{1\rho}H>$ calculated from $T_{1\rho}H$ obtained by these peaks was 0.38.

Example 9

<Film Production>

Films were produced using Polymer Composition 4 and Polymer Composition 9. The films were formed as the same manner with Example 6.

A uniform film could be formed when Polymer Composition 4 was used, but when Polymer Composition 9 was used, the obtained film had cloudiness.

The copolymer of the present invention has an excellent solubility in an organic solvent, and a high glass transition temperature in good balance. Accordingly, a polymer LED using said copolymer can be preferably used for a liquid crystal display as the back light, a light source having plane or curved surface for lighting, a segment type display and a dot matrix type flat panel display.

What is claimed is:

1. A copolymer having a polystyrene reduced number average molecular weight of $10^3$–$10^8$, and comprising a repeating unit represented by formula (1), one or more kinds of repeating units represented by formula (2), and one or more kinds of repeating units represented by formula (3),

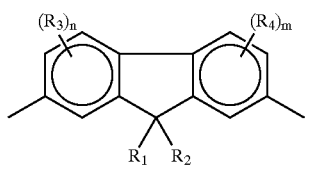

(1)

wherein, $R_1$ and $R_2$ each independently show a hydrogen atom, alkyl group, aryl group, or monovalent heterocyclic group; $R_3$ and $R_4$ each independently show alkyl group, alkoxy group, alkylthio group, alkylsilyl group, alkylamino group, aryl group, aryloxy group, arylsilyl group, arylamino group, arylalkyl group, arylalkoxy group, arylalkyl silyl group, arylalkyl amino group, monovalent heterocyclic group, or cyano group; m and n each independently show an integer of 0–3; when n is two or more, a plurality of $R_3$s may be the same or different; when m is two or more, a plurality of $R_4$ may be the same or different; two or more of $R_1$, $R_2$, $R_3$ and $R_4$, may be mutually connected to form a ring; and when $R_1$, $R_2$, $R_3$, or $R_4$ contains an alkyl chain, the alkyl chain may be interrupted by a group containing a hetero atom,

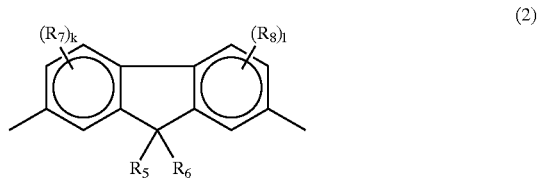

(2)

wherein, $R_5$ and $R_6$ each independently show a hydrogen atom, alkyl group, aryl group, or a monovalent heterocyclic group; either $R_5$ or $R_6$ is different from either $R_1$ or $R_2$; $R_7$ and $R_8$ each independently show an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, monovalent heterocyclic group, or cyano group; k and l are each independently an integer of 0–3; when k is two or more, a plurality of $R_7$s are the same or different; when l is two or more, a plurality of $R_8$ is the same or different; two or more of $R_5$, $R_6$, $R_7$ and $R_8$, may be connected mutually to form a ring; and when $R_5$, $R_6$, $R_7$, or $R_8$ contains an alkyl chain, the alkyl chain may be interrupted by a group containing a hetero atom, —Ar$_1$—  (3)

wherein, $Ar_1$ shows an arylene group, divalent heterocyclic group, or divalent aromatic amine group.

2. A copolymer according to claim 1, wherein the total of the repeating units represented by the above formulas (1), (2) and (3) is 50% by mole or more based on all of the repeating units contained in the copolymer; the repeating unit represented by formula (1) is 10–90% by mole based on the total of the repeating units represented by the above formulas (1) and (2); and the total of the repeating unit represented by formula (3) is 10% by mole or more based on the total of the repeating units represented by the above formulas (1), (2) and (3).

3. A copolymer having a polystyrene reduced number average molecular weight of $10^3$–$10^8$, wherein the copolymer comprises a repeating unit represented by formula (1) and one or more kinds of repeating units represented by formula (2); the repeating unit represented by an above formula (1) is 10–40% based on the total of the moles of the repeating unit represented by the above formulas (1) and (2); and the formula weight of the repeating unit represented by formula (1) is smaller than any of the formula weight of the repeating unit represented by formula (2)

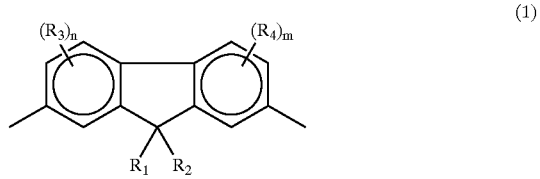

(1)

wherein, $R_1$ and $R_2$ each independently show a hydrogen atom, alkyl group, aryl group, or monovalent heterocyclic group; $R_3$ and $R_4$ each independently show alkyl group, alkoxy group, alkylthio group, alkylsilyl group, alkylamino group, aryl group, aryloxy group, arylsilyl group, arylamino group, arylalkyl group, arylalkoxy group, arylalkyl silyl group, arylalkyl amino group, monovalent heterocyclic group, or cyano group; m and n each independently show an integer of 0–3; when n is two or more, a plurality of $R_3$s may be the same or different; when m is two or more, a plurality of $R_4$ may be the same or different; two or more of $R_1$, $R_2$, $R_3$ and $R_4$, may be mutually connected to form a ring; and when $R_1$, $R_2$, $R_3$ or $R_4$ contains an alkyl chain, the alkyl chain may be interrupted by a group containing a hetero atom,

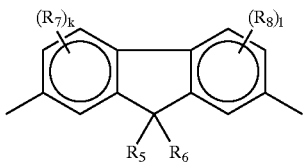

(2)

wherein, $R_5$ and $R_6$ each independently show a hydrogen atom, alkyl group, aryl group, or a monovalent heterocyclic group; either $R_5$ or $R_6$ is different from either $R_1$ or $R_2$; $R_7$ and $R_8$ each independently show an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, monovalent heterocyclic group, or cyano group; k and l are each independently an integer of 0–3; when k is two or more, a plurality of $R_7$s are the same or different; when l is two or more, a plurality of $R_8$ is the same or different; two or more of $R_5$, $R_6$, $R_7$ and $R_8$, may be connected mutually to form a ring; and when $R_5$, $R_6$, $R_7$ or $R_8$ contains an alkyl chain, the alkyl chain may be interrupted by a group containing a hetero atom.

4. A copolymer according to claim 3, wherein the total of the repeating units represented by formula (1) and formula (2) is 50% by mole or more based on all of the repeating units contained in the copolymer.

5. A copolymer according to any one of claims 1 to 4, wherein $R_1$ and $R_2$ in formula (1) are each independently a group selected from alkyl groups having five or less of carbon atoms; $R_5$ and $R_6$ in formula (2) are each independently a group selected from an aryl group, monovalent heterocyclic group, and alkyl group having seven or more carbon atoms.

6. A copolymer having a polystyrene reduced number average molecular weight of $10^3$–$10^8$, and exhibiting fluorescence in the solid state, wherein the value ($\Delta T_1\rho H$/$<T_1\rho H>$) obtained by dividing the difference ($\Delta T_1\rho H$) between the maximum value of $T_1\rho H$ and the minimum value of $T_1\rho H$ by the average value ($<T_1\rho H>$) of $T_1\rho H$, is 0.35 or less; here, relaxation-time ($T_1\rho H$) of proton in a spin lock magnetic field is measured by $^{13}C$ nuclear magnetic resonance with carrying out high-speed rotation of the film of the copolymer around a magic angle in solid nuclear magnetic resonance.

7. A copolymer according to any one of claims 1 to 4, wherein $\Delta T_1\rho H$/$<T_1\rho H>$ obtained by dividing the difference ($\Delta T_1\rho H$) between the maximum value of $T_1\rho H$ and the minimum value of $T_1\rho H$ by the average value ($<T_1\rho H>$) of $T_1\rho H$, is 0.35 or less; here, relaxation-time ($T_1\rho H$) of proton in a spin lock magnetic field is measured by $^{13}C$ nuclear magnetic resonance with carrying out high-speed rotation of the film of the copolymer around a magic angle in solid nuclear magnetic resonance.

8. A polymer composition comprising a polymer compound having a polystyrene reduced number average molecular weight of $10^3$–$10^8$, and exhibiting fluorescence in the solid state, and a copolymer according to any one of claims 1 to 4.

9. A polymer composition comprising a copolymer having a polystyrene reduced number average molecular weight of $10^3$–$10^8$, and comprising a repeating unit represented by formula (1), one or more kinds of repeating units represented by formula (2), and one or more kinds of repeating units represented by formula (3),

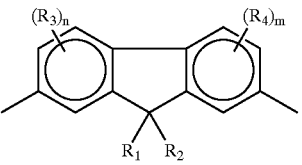

(1)

wherein, $R_1$ and $R_2$ each independently show a hydrogen atom, alkyl group, aryl group, or monovalent heterocyclic group; $R_3$ and $R_4$ each independently show alkyl group, alkoxy group, alkylthio group, alkylsilyl group, alkylamino group, aryl group, aryloxy group, arylsilyl group, arylamino group, arylalkyl group, arylalkoxy group, arylalkyl silyl group, arylalkyl amino group, monovalent heterocyclic group, or cyano group; m and n each independently show an integer of 0–3; when n is two or more, a plurality of $R_3$s may be the same or different; when m is two or more, a plurality of $R_4$ may be the same or different; two or more of $R_1$, $R_2$, $R_3$ and $R_4$, may be mutually connected to form a ring; and when $R_1$, $R_2$, $R_3$ or $R_4$ contains an alkyl chain, the alkyl chain may be interrupted by a group containing a hetero atom,

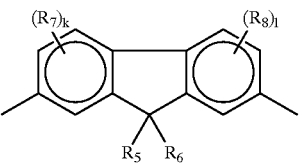

(2)

wherein, $R_5$ and $R_6$ each independently show a hydrogen atom, alkyl group, aryl group, or a monovalent heterocyclic group; either $R_5$ or $R_6$ is different from either $R_1$ or $R_2$; $R_7$ and $R_8$ each independently show an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, monovalent heterocyclic group, or cyano group; k and l are each independently an integer of 0–3; when k is two or more, a plurality of $R_7$s are the same or different; when l is two or more, a plurality of $R_8$ is the same or different; two or more of $R_5$, $R_6$, $R_7$ and $R_8$, may be connected mutually to form a ring; and when $R_5$, $R_6$, $R_7$ or $R_8$ contains an alkyl chain, the alkyl chain may be interrupted by a group containing a hetero atom, —$Ar_1$— (3)

wherein, $Ar_1$ shows an arylene group, divalent heterocyclic group, or divalent aromatic amine group, and a copolymer having a polystyrene reduced number average molecular weight of $10^3$–$10^8$, wherein the copolymer comprises a repeating unit represented by the above formula (1) and one or more kinds of repeating units represented by the above formula (2); the repeating unit represented by an above formula (1) is 10–40% based on the total of the moles of the repeating unit represented by the above formulas (1) and (2); and the formula weight of the repeating unit represented by formula (1) is smaller than any of the formula weight of the repeating unit represented by formula (2).

10. A polymer composition exhibiting fluorescence in the solid state, and comprising two or more kinds of polymer compounds having a polystyrene reduced number average molecular weight of $10^3$–$10^8$, wherein $\Delta T_1\rho H/<T_1\rho H>$ is 0.35 or less, here, $T_1\rho H$ is measured by $^{13}C$ nuclear magnetic resonance with carrying out high-speed rotation of the film of the polymer composition around a magic angle in solid nuclear magnetic resonance.

11. A polymer composition according to claim 8, wherein $\Delta T_1\rho H/<T_1\rho H>$ obtained by dividing the difference ($\Delta T_1\rho H$) between the maximum value of $T_1\rho H$ and the minimum value of $T_1\rho H$ by the average value ($<T_1\rho H>$) of $T_1\rho H$, is 0.35 or less; here, relaxation-time ($T_1\rho H$) of proton in a spin lock magnetic field is measured by $^{13}C$ nuclear magnetic resonance with carrying out high-speed rotation of the film of the copolymer around a magic angle in solid nuclear magnetic resonance.

12. A polymer light-emitting device having a light emitting layer between the electrodes consisting of an anode and a cathode, wherein said light emitting layer comprises a copolymer according to any one of claims 1 and 6.

13. A polymer light-emitting device according to claim 12, wherein a layer containing a conductive polymer is disposed at least between one electrode and the light emitting layer such that the layer containing a conductive polymer is adjacent to said electrode.

14. A polymer light-emitting device according to claim 12, wherein an insulation layer having a thickness of 2 nm or less is disposed at least between one electrode and the light emitting layer such that the insulation layer is adjacent to said electrode.

15. A polymer light-emitting device according to claim 12, wherein an electron-transporting layer is disposed between the cathode and the light emitting layer such that the electron-transporting layer is adjacent to said light-emitting layer.

16. A polymer light-emitting device according to claim 12, wherein a hole-transporting layer is disposed between the anode and the light emitting layer such that the hole-transporting layer is adjacent to said light-emitting layer.

17. A polymer light-emitting device according to claim 12, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

18. A flat light source using a polymer light-emitting device according to claim 12.

19. A segment display using a polymer light-emitting device according to claim 12.

20. A dot matrix display using a polymer light-emitting device according to claim 12.

21. A liquid crystal display using a polymer light-emitting device according to claim 12 as a back light.

22. A method for evaluating a solubility of a copolymer exhibiting fluorescence in the solid state in an organic solvent, wherein said method uses $\Delta T_1\rho H/<T_1\rho H>$ obtained from $T_1\rho H$ measured by $^{13}C$ nuclear magnetic resonance with high-speed rotation of the copolymer film around the magic angle in solid nuclear magnetic resonance.

23. A method for evaluating a homogeneity of a film of a polymer composition consisting of two or more kinds of polymer compounds exhibiting fluorescence in the solid state, and having a polystyrene reduced number average molecular weight of $10^3$–$10^8$, wherein said method uses $\Delta T_1\rho H/<T_1\rho H>$ obtained by measuring $T_1\rho H$ by $^{13}C$ nuclear magnetic resonance with high-speed rotation of the copolymer film around the magic angle in solid nuclear magnetic resonance.

24. A copolymer according to claim 5, wherein $\Delta T_1\rho H/<T_1\rho H>$ obtained dividing the difference ($\Delta T_1\rho H$) between the maximum value of $T_1\rho H$ and the minimum value of $T_1\rho H$ by the average value ($<T_1\rho H>$) of $T_1\rho H$, is 0.35 or less; here, relaxation-time ($T_1\rho H$) of proton in a spin lock magnetic field is measured by $^{13}C$ nuclear magnetic resonance with carrying out high-speed rotation of the film of the copolymer around a magnetic angle in solid nuclear magnetic resonance.

25. A polymer composition comprising a polymer compound having a polystyrene reduced number average molecular weight of $10^3$–$10^8$, and exhibiting fluorescence in the solid state, and a copolymer according to claim 5.

26. A polymer composition comprising a copolymer having a polystyrene reduced number average molecular weight of $10^3$–$10^8$, and comprising a repeating unit represented by formula (1), one or more kinds of repeating units represented by formula (2), and one or more kinds of repeating units represented by formula (3),

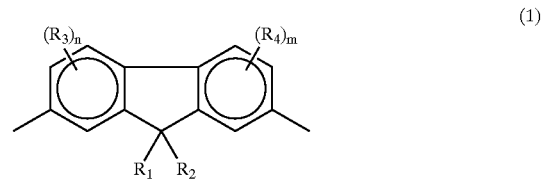

(1)

wherein, $R_1$ and $R_2$ each independently show a hydrogen atom, alkyl group, aryl group, or monovalent heterocyclic group; $R_3$ and $R_4$ each independently show alkyl group, alkoxy group, alkylthio group, alkylsilyl group, alkylamino group, aryl group, aryloxy group, arylsilyl group, arylamino group, arylalkyl group, arylalkoxy group, arylalkyl silyl group, arylalkyl amino group, monovalent heterocyclic group, or cyano group; m and n each independently show an integer of 0–3; when n is two or more, a plurality of $R_3$s may be the same or different; when m is two or more, a plurality of $R_4$ may be the same or different; two or more of $R_1$, $R_2$, $R_3$ and $R_4$, may be mutually connected to form a ring; and when $R_1$, $R_2$, $R_3$ or $R_4$ contains an alkyl chain, the alkyl chain may be interrupted by a group containing a hetero atom,

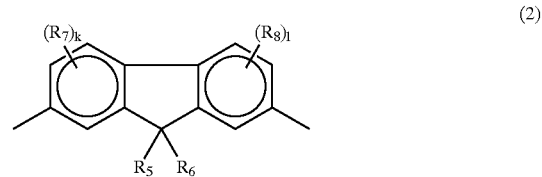

(2)

wherein, $R_5$ and $R_6$ each independently show a hydrogen atom, alkyl group, aryl group, or a monovalent heterocyclic group; either $R_5$ or $R_6$ is different from either $R_1$ or $R_2$; $R_7$ and $R_8$ each independently show an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, monovalent heterocyclic group, or cyano group; k and l are each independently an integer of 0–3; when k is two or more, a plurality of $R_7$s are the same or different; when l is two or more, a plurality of $R_8$ is the same or different; two or more of $R_5$, $R_6$, $R_7$ and $R_8$, may be connected mutually to form a ring; and when $R_5$, $R_6$, $R_7$ or $R_8$ contains an alkyl chain, the alkyl chain may be interrupted by a group containing a hetero atom, $$-Ar_1- \quad (3)$$

wherein, $Ar_1$ shows an arylene group, divalent heterocyclic group, or divalent aromatic amine group, and a copolymer having a polystyrene reduced number average molecular weight of $10^3$–$10^8$, wherein the copolymer comprises a repeating unit represented by the above formula (1) and one or more kinds of repeating units represented by the above formula (2); the repeating unit represented by an above formula (1) is 10–40% based on the total of the moles of the repeating unit represented by the above formulas (1) and (2); and the formula weight of the repeating unit represented by formula (1) is smaller than any of the formula weight of the repeating unit represented by formula (2); and wherein the total of the repeating units represented by formula (1) and formula (2) is 50% by mole or more based on all of the repeating units contained in the copolymer.

27. A polymer composition comprising a copolymer having a polystyrene reduced number average molecular weight of $10^3$–$10^8$, and comprising a repeating unit represented by formula (1), one or more kinds of repeating units represented by formula (2), and one or more kinds of repeating units represented by formula (3),

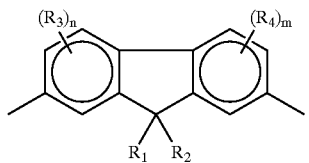

(1)

wherein, $R_1$ and $R_2$ each independently show a hydrogen atom, alkyl group, aryl group, or monovalent heterocyclic group; $R_3$ and $R_4$ each independently show alkyl group, alkoxy group, alkylthio group, alkylsilyl group, alkylamino group, aryl group, aryloxy group, arylsilyl group, arylamino group, arylalkyl group, arylalkoxy group, arylalkyl silyl group, arylalkyl amino group, monovalent heterocyclic group, or cyano group; m and n each independently show an integer of 0–3; when n is two or more, a plurality of $R_3$s may be the same or different; when m is two or more, a plurality of $R_4$ may be the same or different; two or more of $R_1$, $R_2$, $R_3$ and $R_4$, may be mutually connected to form a ring; and when $R_1$, $R_2$, $R_3$ or $R_4$ contains an alkyl chain, the alkyl chain may be interrupted by a group containing a hetero atom,

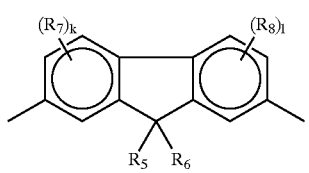

(2)

wherein, $R_5$ and $R_6$ each independently show a hydrogen atom, alkyl group, aryl group, or a monovalent heterocyclic group; either $R_5$ or $R_6$ is different from either $R_1$ or $R_2$; $R_7$ and $R_8$ each independently show an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, monovalent heterocyclic group, or cyano group; k and l are each independently an integer of 0–3; when k is two or more, a plurality of $R_7$s are the same or different; when l is two or more, a plurality of $R_8$ is the same or different; two or more of $R_5$, $R_6$, $R_7$ and $R_8$, may be connected mutually to form a ring; and when $R_5$, $R_6$, $R_7$ or $R_8$ contains an alkyl chain, the alkyl chain may be interrupted by a group containing a hetero atom, $$-Ar_1- \quad (3)$$

wherein, $Ar_1$ shows an arylene group, divalent heterocyclic group, or divalent aromatic amine group; wherein the total of the repeating units represented by the above formulas (1), (2) and (3) is 50 % by mole or more based on all of the repeating units contained in the copolymer; the repeating unit represented by formula (1) is 10–90% by mole based on the total of the repeating units represented by the above formulas (1) and (2); and the total of the repeating unit represented by formula (3) is 10% by mole or more based on the total of the repeating units represented by the above formulas (1), (2) and (3), and a copolymer having a polystyrene reduced number average molecular weight of $10^3$–$10^8$, wherein the copolymer comprises a repeating unit represented by the above formula (1) and one or more kinds of repeating units represented by the above formula (2); the repeating unit represented by an above formula (1) is 10–40% based on the total of the moles of the repeating unit represented by the above formulas (1) and (2); and the formula weight of the repeating unit represented by formula (1) is smaller than any of the formula weight of the repeating unit represented by formula (2).

28. A polymer composition comprising a copolymer having a polystyrene reduced number average molecular weight of $10^3$–$10^8$, and comprising a repeating unit represented by formula (1), one or more kinds of repeating units represented by formula (2), and one or more kinds of repeating units represented by formula (3),

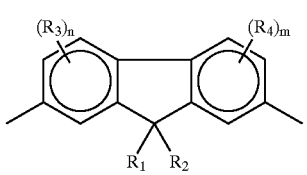

(1)

wherein, $R_1$ and $R_2$ each independently show a hydrogen atom, alkyl group, aryl group, or monovalent heterocyclic group; $R_3$ and $R_4$ each independently show alkyl group, alkoxy group, alkylthio group, alkylsilyl group, alkylamino group, aryl group, aryloxy group, arylsilyl group, arylamino group, arylalkyl group, arylalkoxy group, arylalkyl silyl group, arylalkyl amino group, monovalent heterocyclic group, or cyano group; m and n each independently show an integer of 0–3; when n is two or more, a plurality of $R_3$s may be the same or different; when m is two or more, a plurality of $R_4$ may be the same or different; two or more of $R_1$, $R_2$, $R_3$ and $R_4$, may be mutually connected to form a ring; and when $R_1$, $R_2$, $R_3$ or $R_4$ contains an alkyl chain, the alkyl chain may be interrupted by a group containing a hetero atom,

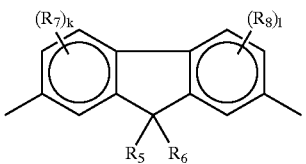

(2)

wherein, $R_5$ and $R_6$ each independently show a hydrogen atom, alkyl group, aryl group, or a monovalent heterocyclic group; either $R_5$ or $R_6$ is different from either $R_1$ or $R_2$; $R_7$ and $R_8$ each independently show an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, monovalent heterocyclic group, or cyano group; k and l are each independently an integer of 0–3; when k is two or more, a plurality of $R_7$s are the same or different; when l is two or more, a plurality of $R_8$ is the same or different; two or more of $R_5$, $R_6$, $R_7$ and $R_8$, may be connected mutually to form a ring; and when $R_5$, $R_6$, $R_7$ or $R_8$ contains an alkyl chain, the alkyl chain may be interrupted by a group containing a hetero atom, —$Ar_1$— (3)

wherein, $Ar_1$ shows an arylene group, divalent heterocyclic group, or divalent aromatic amine group; wherein the total of the repeating units represented by the above formulas (1), (2) and (3) is 50% by mole or more based on all of the repeating units contained in the copolymer; the repeating unit represented by formula (1) is 10–90% by mole based on the total of the repeating units represented by the above formulas (1) and (2); and the total of the repeating unit represented by formula (3) is 10% by mole or more based on the total of the repeating units represented by the above formulas (1), (2) and (3), and a copolymer having a polystyrene reduced number average molecular weight of $10^3$–$10^8$, wherein the copolymer comprises a repeating unit represented by the above formula (1) and one or more kinds of repeating units represented by the above formula (2); the repeating unit represented by an above formula (1) is 10–40% based on the total of the moles of the repeating unit represented by the above formulas (1) and (2); and the formula weight of the repeating unit represented by formula (1) is smaller than any of the formula weight of the repeating unit represented by formula (2); wherein the total of the repeating units represented by formula (1) and formula (2) is 50% by mole or more based on all of the repeating units contained in the copolymer.

29. A polymer composition according to claim 9, wherein $\Delta T_1\rho H/<T_1\rho H>$ obtained by dividing the difference ($\Delta T_1\rho H$) between the maximum value of $T_1\rho H$ and the minimum value of $T_1\rho H$ by the average value ($<T_1\rho H>$) of $T_1\rho H$, is 0.35 or less; here, relaxation-time ($T_1\rho H$) of proton in a spin lock magnetic field is measured by $^{13}C$ nuclear magnetic resonance with carrying out high-speed rotation of the film of the copolymer around a magic angle in solid nuclear magnetic resonance.

30. A polymer composition according to claim 26, wherein $\Delta T_1\rho H/<T_1\rho H>$ obtained by dividing the difference ($\Delta T_1\rho H$) between the maximum value of $T_1\rho H$ and the minimum value of $T_1\rho H$ by the average value ($<T_1\rho H>$) of $T_1\rho H$, is 0.35 or less; here, relaxation-time ($T_1\rho H$) of proton in a spin lock magnetic field is measured by $^{13}C$ nuclear magnetic resonance with carrying out high-speed rotation of the film of the copolymer around a magic angle in solid nuclear magnetic resonance.

31. A polymer composition according to claim 27, wherein $\Delta T_1\rho H/<T_1\rho H>$ obtained by dividing the difference ($\Delta T_1\rho H$) between the maximum value of $T_1\rho H$ and the minimum value of $T_1\rho H$ by the average value ($<T_1\rho H>$) of $T_1\rho H$, is 0.35 or less; here, relaxation-time ($T_1\rho H$) of proton in a spin lock magnetic field is measured by $^{13}C$ nuclear magnetic resonance with carrying out high-speed rotation of the film of the copolymer around a magic angle in solid nuclear magnetic resonance.

32. A polymer composition according to claim 28, wherein $\Delta T_1\rho H/<T_1\rho H>$ obtained by dividing the difference ($\Delta T_1\rho H$) between the maximum value of $T_1\rho H$ and the minimum value of $T_1\rho H$ by the average value ($<T_1\rho H>$) of $T_1\rho H$, is 0.35 or less; here, relaxation-time ($T_1\rho H$) of proton in a spin lock magnetic field is measured by $^{13}C$ nuclear magnetic resonance with carrying out high-speed rotation of the film of the copolymer around a magic angle in solid nuclear magnetic resonance.

33. A polymer light-emitting device having a light emitting layer between the electrodes consisting of an anode and a cathode, wherein said light emitting layer comprises a copolymer according to claim 5.

34. A polymer light-emitting device having a light emitting layer between the electrodes consisting of an anode and a cathode, wherein said light emitting layer comprises a copolymer according to claim 7.

35. A polymer light-emitting device having a light emitting layer between the electrodes consisting of an anode and a cathode, wherein said light emitting layer comprises a copolymer according to claim 24.

36. A polymer light-emitting device having a light emitting layer between the electrodes consisting of an anode and a cathode, wherein said light emitting layer comprises a polymer composition according to claim 8.

37. A polymer light-emitting device having a light emitting layer between the electrodes consisting of an anode and a cathode, wherein said light emitting layer comprises a polymer composition according to claim 25.

38. A polymer light-emitting device having a light emitting layer between the electrodes consisting of an anode and a cathode, wherein said light emitting layer comprises a polymer composition according to any one of claims 9–10 or 26–28.

39. A polymer light-emitting device having a light emitting layer between the electrodes consisting of an anode and a cathode, wherein said light emitting layer comprises a polymer composition according to claim 11.

40. A polymer light-emitting device according to claim 13, wherein an electron-transporting layer is disposed between the cathode and the light emitting layer such that the electron-transporting layer is adjacent to said light-emitting layer.

41. A polymer light-emitting device according to claim 14, wherein an electron-transporting layer is disposed between the cathode and the light emitting layer such that the electron-transporting layer is adjacent to said light-emitting layer.

42. A polymer light-emitting device according to claim 33, wherein an electron-transporting layer is disposed between the cathode and the light emitting layer such that the electron-transporting layer is adjacent to said light-emitting layer.

43. A polymer light-emitting device according to claim 34, wherein an electron-transporting layer is disposed 44. A polymer light-emitting device according to claim 35, wherein an electron-transporting layer is disposed between the cathode and the light emitting layer such that the electron-transporting layer is adjacent to said light-emitting layer.

45. A polymer light-emitting device according to claim 36, wherein an electron-transporting layer is disposed between the cathode and the light emitting layer such that the electron-transporting layer is adjacent to said light-emitting layer.

46. A polymer light-emitting device according to claim 37, wherein an electron-transporting layer is disposed between the cathode and the light emitting layer such that the electron-transporting layer is adjacent to said light-emitting layer.

47. A polymer light-emitting device according to claim 38, wherein an electron-transporting layer is disposed between the cathode and the light emitting layer such that the electron-transporting layer is adjacent to said light-emitting layer.

48. A polymer light-emitting device according to claim 39, wherein an electron-transporting layer is disposed between the cathode and the light emitting layer such that the electron-transporting layer is adjacent to said light-emitting layer.

49. A polymer light-emitting device according to claim 13, wherein a hole-transporting layer is disposed between the anode and the light emitting layer such that the hole-transporting layer is adjacent to said light-emitting layer.

50. A polymer light-emitting device according to claim 14, wherein a hole-transporting layer is disposed between the anode and the light emitting layer such that the hole-transporting layer is adjacent to said light-emitting layer.

51. A polymer light-emitting device according to claim 33, wherein a hole-transporting layer is disposed between the anode and the light emitting layer such that the hole-transporting layer is adjacent to said light-emitting layer.

52. A polymer light-emitting device according to claim 34, wherein a hole-transporting layer is disposed between the anode and the light emitting layer such that the hole-transporting layer is adjacent to said light-emitting layer.

53. A polymer light-emitting device according to claim 35, wherein a hole-transporting layer is disposed between the anode and the light emitting layer such that the hole-transporting layer is adjacent to said light-emitting layer.

54. A polymer light-emitting device according to claim 36, wherein a hole-transporting layer is disposed between the anode and the light emitting layer such that the hole-transporting layer is adjacent to said light-emitting layer.

55. A polymer light-emitting device according to claim 37, wherein a hole-transporting layer is disposed between the anode and the light emitting layer such that the hole-transporting layer is adjacent to said light-emitting layer.

56. A polymer light-emitting device according to claim 38, wherein a hole-transporting layer is disposed between the anode and the light emitting layer such that the hole-transporting layer is adjacent to said light-emitting layer.

57. A polymer light-emitting device according to claim 39, wherein a hole-transporting layer is disposed between the anode and the light emitting layer such that the hole-transporting layer is adjacent to said light-emitting layer.

58. A polymer light-emitting device according to claim 13, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

59. A polymer light-emitting device according to claim 14, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

60. A polymer light-emitting device according to claim 33, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

61. A polymer light-emitting device according to claim 34, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

62. A polymer light-emitting device according to claim 35, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

63. A polymer light-emitting device according to claim 36, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

64. A polymer light-emitting device according to claim 37, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

65. A polymer light-emitting device according to claim 38, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

66. A polymer light-emitting device according to claim 39, wherein an electron-transporting layer is disposed between the cathode and the light emitting layer such that the electron-transporting layer is adjacent to said light-emitting layer, and a hole-transporting layer is disposed between the anode and the light emitting layer such that the hole-transporting layer is adjacent to said light-emitting layer.

\* \* \* \* \*